(12) United States Patent
Okamoto et al.

(10) Patent No.: US 11,381,058 B2
(45) Date of Patent: Jul. 5, 2022

(54) SEMICONDUCTOR LASER AND ATOMIC OSCILLATOR

(71) Applicant: Seiko Epson Corporation, Tokyo (JP)

(72) Inventors: Junichi Okamoto, Shiojiri (JP); Takashi Hagino, Fujimi (JP); Koichi Kobayashi, Fujimi (JP); Takashi Miyata, Shiojiri (JP)

(73) Assignee: Seiko Epson Corporation

( * ) Notice: Subject to any disclaimer, the term of this patent is extended or adjusted under 35 U.S.C. 154(b) by 280 days.

(21) Appl. No.: 16/832,038

(22) Filed: Mar. 27, 2020

(65) Prior Publication Data

US 2020/0313393 A1 Oct. 1, 2020

(30) Foreign Application Priority Data

Mar. 28, 2019 (JP) .............................. JP2019-064397

(51) Int. Cl.
*H01S 5/183* (2006.01)
*H03L 7/26* (2006.01)
(Continued)

(52) U.S. Cl.
CPC ...... *H01S 5/04254* (2019.08); *H01S 5/18313* (2013.01); *H01S 5/18325* (2013.01); *H03L 7/26* (2013.01); *H01S 5/005* (2013.01)

(58) Field of Classification Search
CPC ... H01S 5/18313; H01S 5/04254; H01S 5/042
(Continued)

(56) References Cited

U.S. PATENT DOCUMENTS 6,134,251 A 10/2000 Kawase et al.
2003/0012242 A1* 1/2003 Iwai .................. H01S 5/18313
372/96

(Continued)

FOREIGN PATENT DOCUMENTS

JP H11-054838 A 2/1999
JP 2003-086896 A 3/2003
(Continued)

OTHER PUBLICATIONS

C. Helms et al., "Reliability of Oxide VCSELs at Emcore", Proceedings of SPIE, vol. 5364, pp. 183-189 (Jun. 2004).

*Primary Examiner* — Tuan N Nguyen
(74) *Attorney, Agent, or Firm* — Harness, Dickey & Pierce, P.L.C.

(57) ABSTRACT

A semiconductor laser including: a first mirror layer; a second mirror layer; an active layer, a current confinement layer, a first region, and a second region, in which the first mirror layer, the second mirror layer, the active layer, the current confinement layer, the first region, and the second region constitute a laminated body, the first region and the second region constitute an oxidized region of the laminated body, in a plan view, the laminated body includes a first part, a second part, and a third part disposed between the first part and the second part and resonating light generated in the active layer, and in a plan view, at least at a part of the third part, W1>W3 and W2>W3, W1 is a width of the oxidized region of the first part, W2 is a width of the oxidized region of the second part, and $W_3$ is a width of the oxidized region of the third part.

9 Claims, 19 Drawing Sheets

(51) Int. Cl.
*H01S 5/00* (2006.01)
*H01S 5/042* (2006.01)

(58) Field of Classification Search
USPC ...................................................... 372/43.01
See application file for complete search history.

(56) References Cited

U.S. PATENT DOCUMENTS

| | | |
|---|---|---|
| 2003/0015726 A1 | 1/2003 | Iwai et al. |
| 2006/0013276 A1 | 1/2006 | McHugo |
| 2007/0091965 A1 | 4/2007 | Tanabe et al. |
| 2008/0240194 A1 | 10/2008 | Maeda et al. |
| 2015/0180204 A1 | 6/2015 | Takenaka et al. |
| 2015/0180205 A1 | 6/2015 | Kaneko et al. |
| 2015/0180207 A1 | 6/2015 | Kaneko et al. |
| 2015/0180214 A1 | 6/2015 | Nishida |
| 2016/0043529 A1* | 2/2016 | Koyama ............. H01S 5/18311 372/28 |

FOREIGN PATENT DOCUMENTS

| | | |
|---|---|---|
| JP | 2006-032964 A | 2/2006 |
| JP | 2007-142375 A | 6/2007 |
| JP | 2008-244060 A | 10/2008 |
| JP | 2015-119136 A | 6/2015 |
| JP | 2015-119138 A | 6/2015 |
| JP | 2015-119145 A | 6/2015 |
| JP | 2015-119147 A | 6/2015 |
| WO | WO-99/007043 A1 | 2/1999 |

* cited by examiner

SEMICONDUCTOR LASER AND ATOMIC OSCILLATOR

The present application is based on, and claims priority from JP Application Serial Number 2019-064397, filed Mar. 28, 2019, the disclosure of which is hereby incorporated by reference herein in its entirety.

BACKGROUND

1. Technical Field

The present disclosure relates to a semiconductor laser and an atomic oscillator.

2. Related Art

A surface emitting semiconductor laser is used as a light source of an atomic oscillator using, for example, coherent population trapping (CPT) which is one of the quantum interference effects. Such a semiconductor laser has two mirror layers and an active layer disposed between the two mirror layers. Furthermore, the semiconductor laser has a current confinement layer for preventing a current injected into the active layer from spreading within the surface of the active layer.

As such a semiconductor laser, for example, JP-A-2015-119138 discloses a semiconductor laser including a lamination structure of a first mirror layer constituted with 40.5 pairs of n-type $Al_{0.12}Ga_{0.88}As$ layer and n-type $Al_{0.9}Ga_{0.1}As$ layer, an active layer, and a second mirror constituted with 20 pairs of p-type $Al_{0.12}Ga_{0.88}As$ layer and p-type $Al_{0.9}Ga_{0.1}As$ layer on the n-type GaAs substrate.

In JP-A-2015-119138, the current confinement layer is formed by changing one layer of the second mirror to a layer having a large Al composition ratio and oxidizing the layer from the side surface. When the current confinement layer is formed, the $Al_{0.9}Ga_{0.1}As$ layer that constitutes the first mirror and the second mirror is also oxidized to form an oxidized region.

In addition, in a surface emitting semiconductor laser, since a resonator generally has an isotropic structure, it is difficult to control a polarization direction of light emitted from the resonator. Here, in JP-A-2015-119138, a distortion applier that applies distortion to a resonance portion is provided to polarize the light.

The oxidized region is formed by replacing the arsenic in the $Al_{0.9}Ga_{0.1}As$ layer with oxygen, but the volume shrinks at this time. Therefore, when the width of the oxidized region of the laminated body is large, a large stress is generated in the resonance portion by the oxidized region. When defects occur in the resonance portion due to this stress, the characteristics of the semiconductor laser change. Meanwhile, when the width of the oxidized region of the laminated body is small, the distortion applied to the resonance portion by the distortion applier is reduced. Therefore, there is a concern that it becomes difficult to hold the polarized light of the light emitted from the resonator.

SUMMARY

The present disclosure can be implemented as the following application examples.

A semiconductor laser according to an application example of the present disclosure includes: a first mirror layer; a second mirror layer; an active layer disposed between the first mirror layer and the second mirror layer; a current confinement layer disposed between the first mirror layer and the second mirror layer; a first region provided continuously with the first mirror layer and including a plurality of first oxidized layers; and a second region provided continuously with the second mirror layer and including a plurality of second oxidized layers, in which the first mirror layer, the second mirror layer, the active layer, the current confinement layer, the first region, and the second region constitute a laminated body, the first region and the second region constitute an oxidized region of the laminated body, in a plan view, the laminated body includes a first part, a second part, and a third part disposed between the first part and the second part and resonating light generated in the active layer, and in a plan view, at least at a part of the third part, W1>W3 and W2>W3, where a width of the oxidized region of the first part is W1, a width of the oxidized region of the second part is W2, and a width of the oxidized region of the third part is W3.

An atomic oscillator according to an application example of the present disclosure includes: a semiconductor laser; an atom cell irradiated with light emitted from the semiconductor laser and containing alkali metal atoms; and a light receiving element that detects intensity of light transmitted through the atom cell and outputs a detection signal, in which the semiconductor laser includes a first mirror layer, a second mirror layer, an active layer disposed between the first mirror layer and the second mirror layer, a current confinement layer disposed between the first mirror layer and the second mirror layer, a first region provided continuously with the first mirror layer and including a plurality of first oxidized layers, and a second region provided continuously with the second mirror layer and including a plurality of second oxidized layers, the first mirror layer, the second mirror layer, the active layer, the current confinement layer, the first region, and the second region constitute a laminated body, the first region and the second region constitute an oxidized region of the laminated body, in a plan view, the laminated body includes a first part, a second part, and a third part disposed between the first part and the second part and resonating light generated in the active layer, and in a plan view, at least at a part of the third part, W1>W3 and W2>W3, where a width of the oxidized region of the first part is W1, a width of the oxidized region of the second part is W2, and a width of the oxidized region of the third part is W3.

DESCRIPTION OF EXEMPLARY EMBODIMENTS

Hereinafter, appropriate embodiments of the present disclosure will be described in detail with reference to the drawings. The embodiments described below are not inappropriately limited to the contents of the present disclosure described in the appended claims. In addition, not all of the configurations described below are essential configuration requirements of the present disclosure.

1. First Embodiment

1.1. Semiconductor Laser

Figure 1:
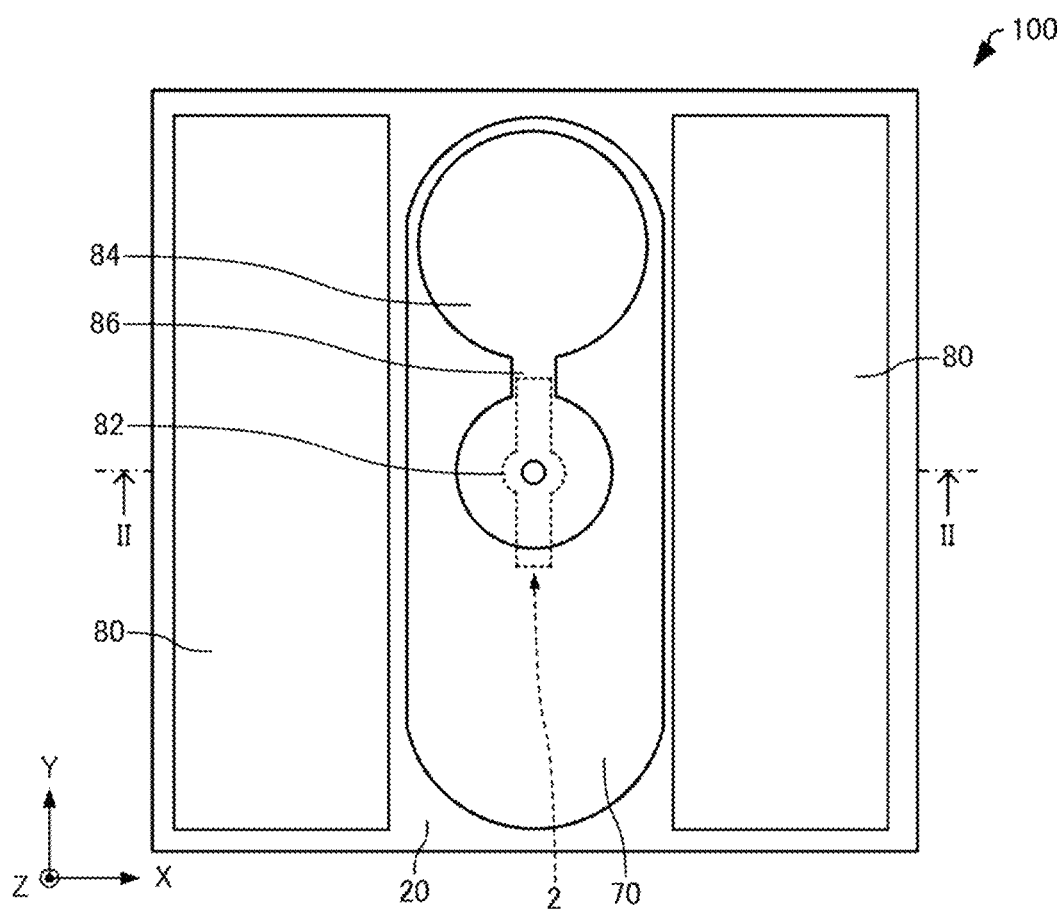
FIG. 1 is a plan view schematically illustrating a semiconductor laser according to a first embodiment.
Figure 2:
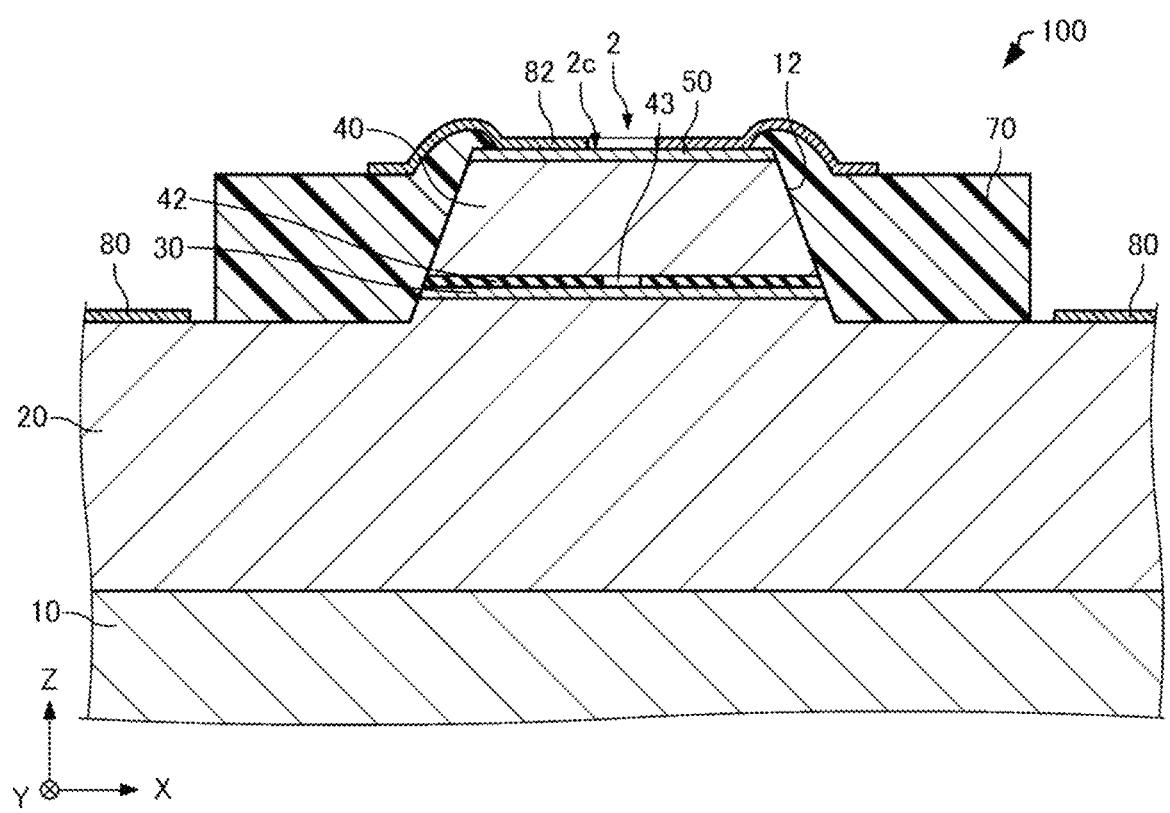
FIG. 2 is a sectional view schematically illustrating the semiconductor laser according to the first embodiment.
Figure 3:
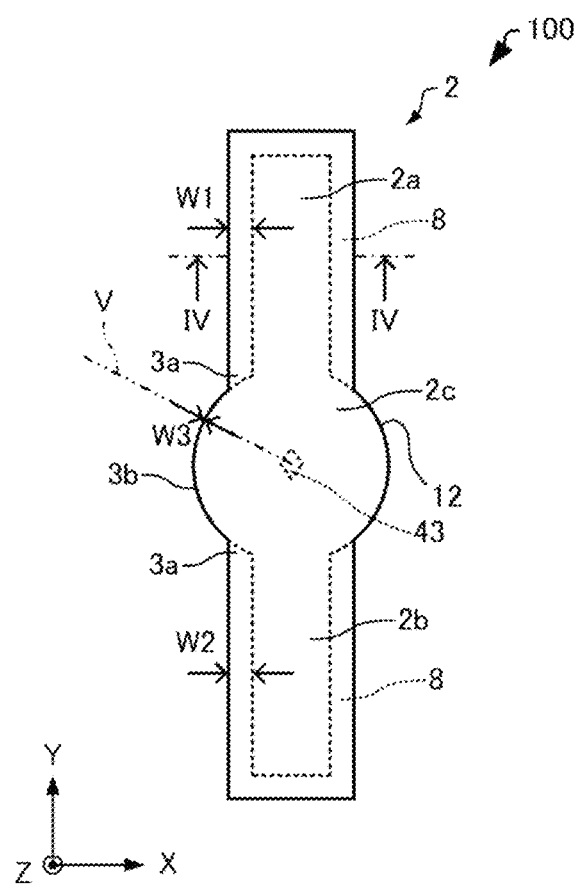
FIG. 3 is a plan view schematically illustrating the semiconductor laser according to the first embodiment.
Figure 4:
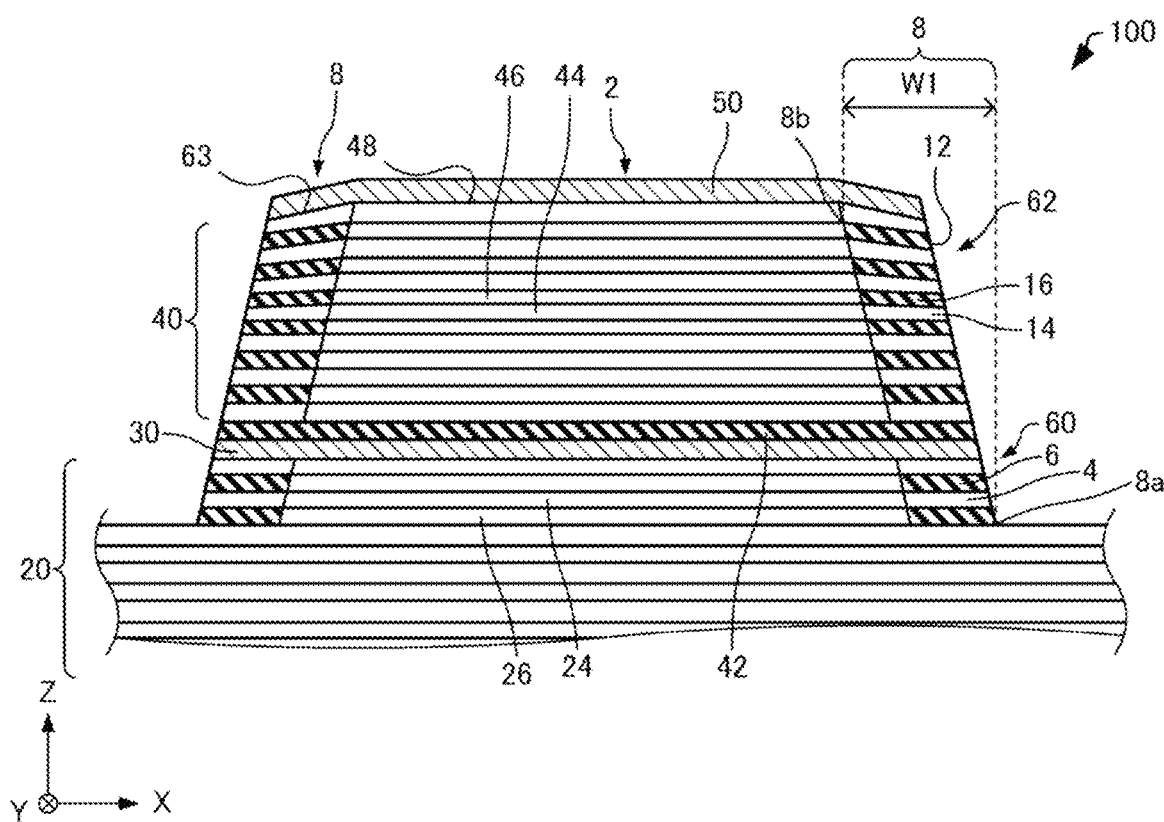
FIG. 4 is a sectional view schematically illustrating the semiconductor laser according to the first embodiment.

First, a semiconductor laser according to a first embodiment will be described with reference to the drawings. FIG. 1 is a plan view schematically illustrating a semiconductor laser 100 according to the first embodiment. FIG. 2 is a sectional view taken along the line II-II of FIG. 1, schematically illustrating the semiconductor laser 100 according to the first embodiment. FIG. 3 is a plan view schematically illustrating the semiconductor laser 100 according to the first embodiment. FIG. 4 is a sectional view taken along the line IV-IV of FIG. 3, schematically illustrating the semiconductor laser 100 according to the first embodiment.

For convenience, in FIG. 2, a laminated body 2 is illustrated in a simplified manner. In FIG. 3, members other than the laminated body 2 of the semiconductor laser 100 are not illustrated. FIGS. 1 to 4 illustrate an X axis, a Y axis, and a Z axis as three axes orthogonal to each other. Further, in this specification, a positional relationship in the semiconductor laser 100 will be described with a second electrode 82 side upward and a substrate 10 side downward, relatively.

The semiconductor laser 100 is, for example, a vertical cavity surface emitting laser (VCSEL). As illustrated in FIGS. 1 to 4, the semiconductor laser 100 includes the substrate 10, a first mirror layer 20, an active layer 30, a second mirror layer 40, a current confinement layer 42, a contact layer 50, a first region 60, a second region 62, a resin layer 70, a first electrode 80, and a second electrode 82.

The substrate 10 is, for example, a first conductivity type GaAs substrate. The first conductivity type is, for example, an n type.

The first mirror layer 20 is disposed over the substrate 10. The first mirror layer 20 is disposed on the substrate 10 side with respect to the active layer 30. The first mirror layer 20 is disposed between the substrate 10 and the active layer 30. The first mirror layer 20 is, for example, an n-type semiconductor layer. The first mirror layer 20 is a distributed bragg reflector (DBR) mirror. As illustrated in FIG. 4, the first mirror layer 20 is constituted by alternately laminating high refractive index layers 24 and low refractive index layers 26. The high refractive index layer 24 is, for example, an n-type $Al_{0.12}Ga_{0.88}As$ layer doped with silicon. The low refractive index layer 26 is, for example, an n-type $Al_{0.9}Ga_{0.1}As$ layer doped with silicon. The lamination number of the high refractive index layers 24 and the low refractive index layers 26 is, for example, 10 pairs or more and 50 pairs or less.

The active layer 30 is disposed over the first mirror layer 20. The active layer 30 is disposed between the first mirror layer 20 and the second mirror layer 40. The active layer 30 has, for example, a multi quantum well (MQW) structure in which three layers of quantum well structures constituted with an i-type $In_{0.06}Ga_{0.94}As$ layer and an i-type $Al_{0.3}Ga_{0.7}As$ layer are laminated.

The second mirror layer 40 is disposed over the active layer 30. The second mirror layer 40 is disposed on the side opposite to the substrate 10 side with respect to the active layer 30. The second mirror layer 40 is disposed between the active layer 30 and the contact layer 50. The second mirror layer 40 is, for example, a second conductivity type semiconductor layer. The second conductivity type is, for example, a p-type. The second mirror layer 40 is a distributed bragg reflection type mirror. The second mirror layer 40 is constituted by alternately laminating high refractive index layers 44 and low refractive index layers 46. The high refractive index layer 44 is, for example, a p-type $Al_{0.12}Ga_{0.88}As$ layer doped with carbon. The low refractive index layer 46 is, for example, a p-type $Al_{0.9}Ga_{0.1}As$ layer doped with carbon. The lamination number of the high refractive index layers 44 and the low refractive index layers 46 is, for example, 3 pairs or more and 40 pairs or less.

The second mirror layer 40, the active layer 30, and the first mirror layer 20 constitute a vertical resonator type pin diode. When a forward voltage of a pin diode is applied between the first electrode 80 and the second electrode 82, recombination of electrons and holes occurs in the active layer 30 and light emission occurs. The light generated in the active layer 30 is subjected to multiple reflection between the first mirror layer 20 and the second mirror layer 40, and stimulated emission occurs at this time, and the intensity is amplified. When the optical gain exceeds the optical loss, laser oscillation occurs, and laser light is emitted from the upper surface of the contact layer 50.

The current confinement layer 42 is disposed between the first mirror layer 20 and the second mirror layer 40. The current confinement layer 42 is disposed between the active layer 30 and the second mirror layer 40. The current confinement layer 42 may be disposed over the active layer 30 or may be disposed inside the second mirror layer 40, for example. The current confinement layer 42 is a to-be-oxidized layer of the $Al_xGa_{1-x}As$ layer when x≥0.95, for example. The current confinement layer 42 has an opening 43 that serves as a current path. The current confinement layer 42 can prevent the current injected into the active layer 30 from spreading within the surface of the active layer 30.

The contact layer 50 is disposed over the second mirror layer 40. The contact layer 50 is a p-type semiconductor layer. Specifically, the contact layer 50 is a p-type GaAs layer doped with carbon.

As illustrated in FIG. 4, the first region 60 is provided on the side of the first mirror layer 20 that constitutes the laminated body 2. The first region 60 includes a plurality of first oxidized layers 6 provided continuously with the first mirror layer 20. Specifically, the first region 60 is constituted such that the first oxidized layer 6 in which a layer continuous with the low refractive index layer 26 that constitutes the first mirror layer 20 is oxidized, and a layer 4 continuous with the high refractive index layer 24 that constitutes the first mirror layer 20 are alternately laminated.

The second region 62 is provided on the side of the second mirror layer 40 that constitutes the laminated body 2. The second region 62 includes a plurality of second oxidized layers 16 provided continuously with the second mirror layer 40. Specifically, the second region 62 is constituted such that the second oxidized layer 16 in which a layer continuous with the low refractive index layer 46 that constitutes the second mirror layer 40 is oxidized, and a layer 14 continuous with the high refractive index layer 44 that constitutes the second mirror layer 40 are alternately laminated.

The first region 60 and the second region 62 constitute an oxidized region 8. As illustrated in FIG. 4, an upper surface 63 of the oxidized region 8 is inclined with respect to an upper surface 48 of the second mirror layer 40.

A part of the first mirror layer 20, the active layer 30, the second mirror layer 40, the current confinement layer 42, the contact layer 50, the first region 60, and the second region 62 constitute the laminated body 2. As illustrated in FIG. 2, the laminated body 2 is columnar. The laminated body 2 is disposed over the first mirror layer 20 and protrudes upward from the first mirror layer 20. The laminated body 2 is surrounded by the resin layer 70. In the illustrated example, a side surface 12 of the laminated body 2 is inclined with respect to the upper surface of the substrate 10. The side surface 12 is in contact with the resin layer 70.

As illustrated in FIG. 3, the laminated body 2 has a first part 2a, a second part 2b, and a third part 2c in a plan view. In addition, the plan view refers to viewing along an axis perpendicular to the substrate 10, and in the illustrated example, refers to viewing along the Z axis. The Z axis is an axis perpendicular to the substrate 10, and the X axis and the Y axis are axes perpendicular to the Z axis and perpendicular to each other.

In the illustrated example, the first part 2a, the second part 2b, and the third part 2c are arranged along the Y axis in a plan view. The third part 2c is disposed between the first part 2a and the second part 2b. The first part 2a protrudes from the third part 2c to one side along the Y axis. The second part 2b protrudes from the third part 2c to the other side along the Y axis. The first part 2a and the second part 2b have, for example, the same shape in a plan view.

The first part 2a is connected to the third part 2c. The second part 2b is connected to the third part 2c. In other words, the first part 2a, the second part 2b, and the third part 2c are provided integrally. The oxidized region 8 is provided along the outer edge of the first part 2a in a plan view. Furthermore, the oxidized region 8 is provided along the outer edge of the second part 2b in a plan view.

The third part 2c resonates the light generated in the active layer 30. In other words, a resonator is formed at the third part 2c. In a plan view, the outer edge of the third part 2c has a curved part. In a plan view, the shape of the part of the third part 2c where the oxidized region 8 is not provided is, for example, a circle.

In a plan view, when the width of the oxidized region 8 of the first part 2a is W1, the width of the oxidized region 8 of the second part 2b is W2, and the width of the oxidized region 8 of the third part 2c is W3, the semiconductor laser 100 satisfies the following expression (1) at least at a part of the third part 2c.

$$W1>W3,\ W2>W3 \quad (1)$$

The width W1 is the maximum width among the width along the X axis of the oxidized region 8 on one side surface intersecting the X axis of the first part 2a, the width along the X axis of the oxidized region 8 on the other side surface intersecting the X axis of the first part 2a, and the width along the Y axis of the oxidized region 8 on the side surface intersecting the Y axis of the first part 2a. In the illustrated example, the widths of the oxidized region 8 on one side surface intersecting the X axis of the first part 2a, on the other side surface intersecting the X axis, and on the side surface intersecting the Y axis are the same as each other and is W1. The entire side surface of the first part 2a is constituted with, for example, the oxidized region 8.

The width W2 is the maximum width among the width along the X axis of the oxidized region 8 on one side surface intersecting the X axis of the second part 2b, the width along the X axis of the oxidized region 8 on the other side surface intersecting the X axis of the second part 2b, and the width along the Y axis of the oxidized region 8 on the other side surface intersecting the Y axis of the second part 2b. In the illustrated example, the widths of the oxidized region 8 on one side surface intersecting the X axis of the second part 2b, on the other side surface intersecting the X axis, and on the other side surface intersecting the Y axis are the same as each other and is W2. The entire side surface of the second part 2b is constituted with, for example, the oxidized region 8.

The width W3 is the smallest width among the widths along a virtual straight line V passing through the center of the opening 43 in a plan view of the oxidized region 8 of the third part 2c. In the illustrated example, the third part 2c has a part 3a of which the side surface is constituted with the oxidized region 8, and a part 3b of which the side surface is not constituted with the oxidized region 8, and the width W3 is the minimum width among the widths along the virtual straight line V at the part 3b. In the semiconductor laser 100, apart of the third part 2c, that is, the part 3b satisfies the expression (1) and W3=0 is satisfied.

As illustrated in FIG. 4, the width of the oxidized region 8 is a distance between an end 8a of the lowermost layer among the plurality of oxidized layers and an end 8b of the uppermost layer among the plurality of oxidized layers on the side surface 12 of the laminated body 2. The end 8a is an end of the lowermost oxidized layer among the plurality of oxidized layers, and is an end opposite to the low refractive index layer continuous with the lowermost oxidized layer. The end 8a constitutes the side surface 12. The end 8b is an end of the uppermost oxidized layer among the plurality of oxidized layers, and is an end on the low refractive index layer side continuous with the uppermost oxidized layer.

In the illustrated example, the end 8a is an end of the lowermost oxidized layer 6 among the plurality of oxidized layers 6 in the first region 60, and is an end opposite to the lower refractive index layer 26 side continuous with the lowermost oxidized layer 6. The end 8b is an end of the uppermost oxidized layer 16 among the plurality of oxidized layers 16 of the second region 62, and is an end on the low refractive index layer 46 side continuous with the uppermost oxidized layer 16.

In the semiconductor laser 100, distortion can be applied to the active layer 30 by the first part 2a and the second part 2b. When the first part 2a and the second part 2b apply distortion to the active layer 30, stress is generated in the active layer 30 in a predetermined direction. Specifically, tensile stress is generated in the active layer 30. As a result, the third part 2c that constitutes the resonator is not optically isotropic, and the light generated in the active layer 30 is polarized. Accordingly, the polarized light of the light generated in the active layer 30 can be stabilized. Here, polarizing the light means making the vibration direction of the electric field of light constant.

As illustrated in FIG. 2, the resin layer 70 is disposed over at least the side surface of the laminated body 2. In the example illustrated in FIG. 1, the resin layer 70 covers the first part 2a and the second part 2b. The material of the resin layer 70 is, for example, polyimide. Since the volume of the polyimide shrinks by substantially 60% to 70% due to hardening shrinkage, the tensile stress generated in the active layer 30 of the third part 2c by the first part 2a and the second part 2b can be promoted.

The first electrode 80 is disposed over the first mirror layer 20. The first electrode 80 is in ohmic contact with the first mirror layer 20. The first electrode 80 is electrically coupled to the first mirror layer 20. As the first electrode 80, a member constituted by laminating a Cr layer, a Pt layer, a Ti layer, a Pt layer, and an Au layer in order from the first mirror layer 20 side is used, for example. The first electrode 80 is one electrode for injecting a current into the active layer 30. Although not illustrated, the first electrode 80 may be provided on the lower surface of the substrate 10.

The second electrode 82 is disposed over the contact layer 50. The second electrode 82 is in ohmic contact with the contact layer 50. In the illustrated example, the second electrode 82 is further disposed over the resin layer 70. The second electrode 82 is electrically coupled to the second mirror layer 40 through the contact layer 50. As the second electrode 82, for example, a layer in which a Cr layer, a Pt layer, a Ti layer, a Pt layer, and an Au layer are laminated in order from the contact layer 50 side is used. The second electrode 82 is the other electrode for injecting a current into the active layer 30.

As illustrated in FIG. 1, the second electrode 82 is electrically coupled to a pad 84. In the illustrated example, the second electrode 82 is electrically coupled to the pad 84 via a lead wiring 86. The pad 84 and the lead wiring 86 are provided on the resin layer 70. The material of the pad 84 and the lead wiring 86 is the same as the material of the second electrode 82, for example.

Although the AlGaAs semiconductor laser has been described above, as the semiconductor laser according to the present disclosure, for example, GaInP-based, ZnSSe-based, InGaN-based, AlGaN-based, InGaAs-based, GaInNAs-based, or GaAsSb-based semiconductor material may be used corresponding to the oscillation wavelength.

1.2. Manufacturing Method of Semiconductor Laser

Next, a manufacturing method of the semiconductor laser 100 according to a first embodiment will be described with reference to the drawings. FIGS. 5 to 9 are sectional views schematically illustrating a manufacturing process of the semiconductor laser 100 according to the first embodiment.

Figure 5:
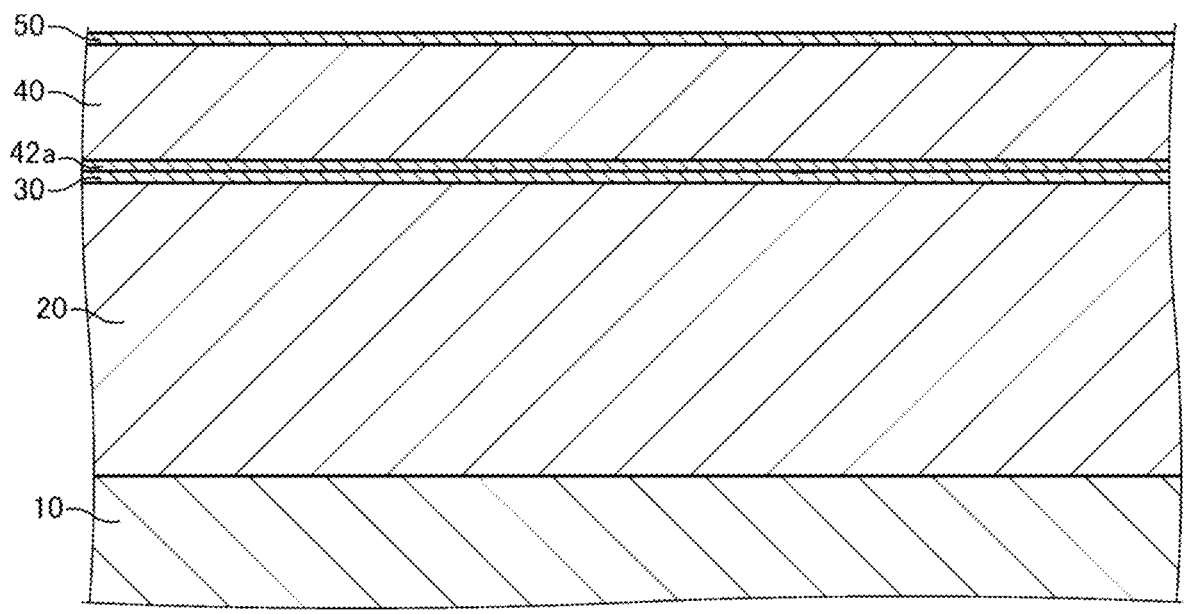
FIG. 5 is a sectional view schematically illustrating a manufacturing process of the semiconductor laser according to the first embodiment.

As illustrated in FIG. 5, the first mirror layer 20, the active layer 30, the to-be-oxidized layer 42a that is oxidized to become the current confinement layer 42, the second mirror layer 40, and the contact layer 50 are epitaxially grown on the substrate 10. Examples of the epitaxial growth method include a metal organic chemical vapor deposition (MOCVD) method, and a molecular beam epitaxy (MBE) method.

Figure 6:
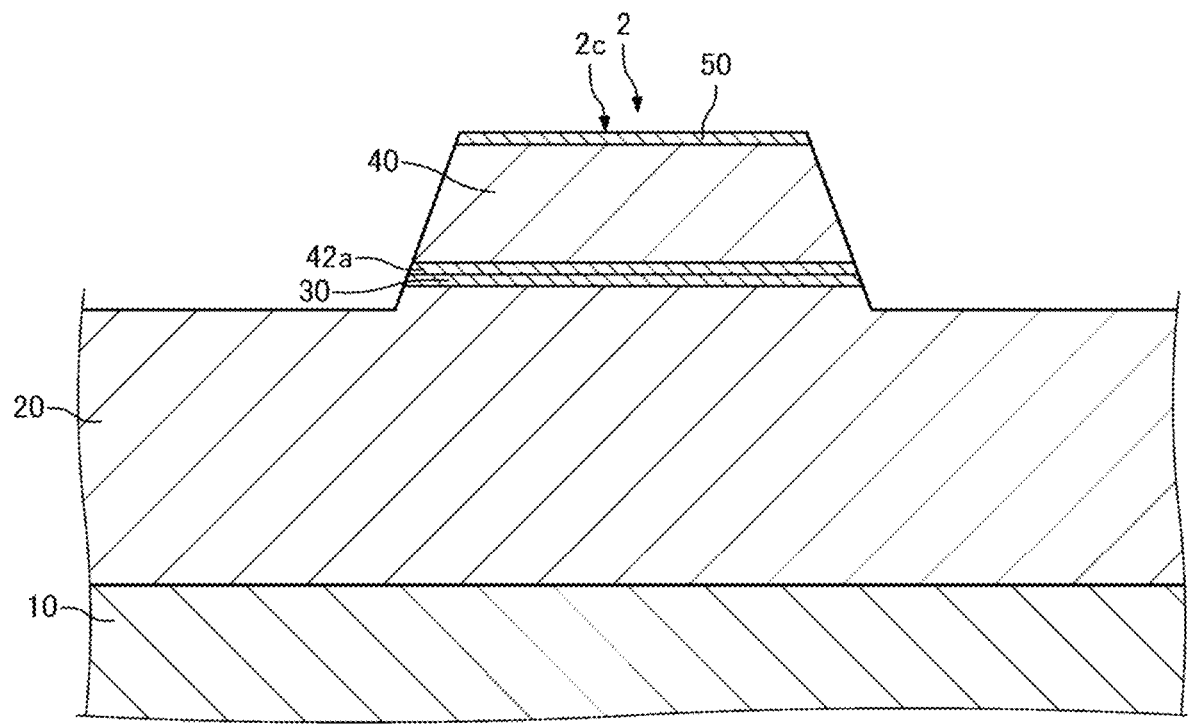
FIG. 6 is a sectional view schematically illustrating the manufacturing process of the semiconductor laser according to the first embodiment.

As illustrated in FIG. 6, the contact layer 50, the second mirror layer 40, the to-be-oxidized layer 42a, the active layer 30, and the first mirror layer 20 are patterned to form the laminated body 2. The patterning is performed by, for example, photolithography and etching.

Figure 7:
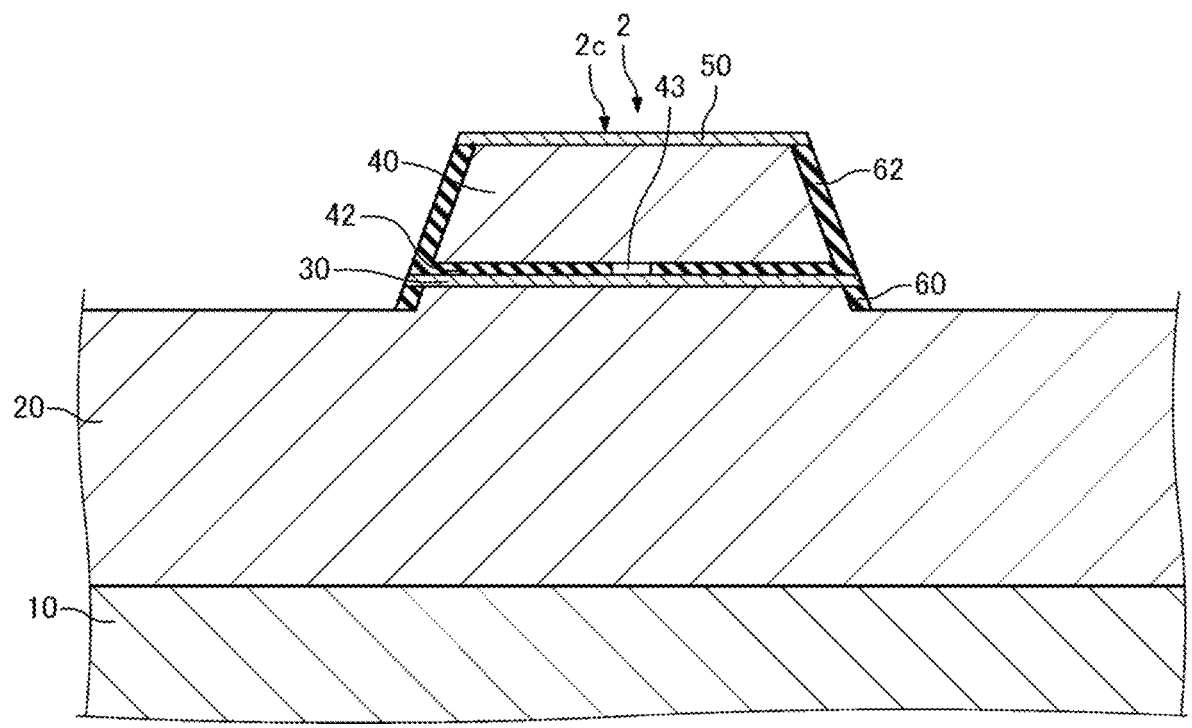
FIG. 7 is a sectional view schematically illustrating the manufacturing process of the semiconductor laser according to the first embodiment.

As illustrated in FIG. 7, the to-be-oxidized layer 42a is oxidized to form the current confinement layer 42. The to-be-oxidized layer 42a is an $Al_xGa_{1-x}As$ layer when $x \geq 0.95$ is satisfied, for example. For example, the current confinement layer 42 is formed by oxidizing the $Al_xGa_{1-x}As$ layer from the side surface by putting the substrate 10 provided with the laminated body 2 in a water vapor atmosphere at substantially 400° C.

In the oxidation process of oxidizing the to-be-oxidized layer 42a to form the current confinement layer 42, arsenic in the $Al_{0.9}Ga_{0.1}As$ layer that constitutes the first mirror layer 20 is replaced with oxygen, and as illustrated in FIG. 4, the first oxidized layer 6 is formed. As a result, the first region 60 is formed. Similarly, arsenic in the $Al_{0.9}Ga_{0.1}As$ layer that constitutes the second mirror layer 40 is replaced with oxygen, and as illustrated in FIG. 4, the second oxidized layer 16 is formed. As a result, the second region 62 is formed.

The volume of the first region 60 and the second region 62 is reduced by replacing arsenic with oxygen. Accordingly, the upper surface 63 of the second region 62 is inclined. Specifically, the first region 60 and the second region 62 are reduced in distance between lattices due to strong electronegativity due to the replacement of arsenic with oxygen, and the volume is reduced by substantially 30%. For convenience, FIG. 7 illustrates the first region 60 and the second region 62 in a simplified manner.

Figure 8:
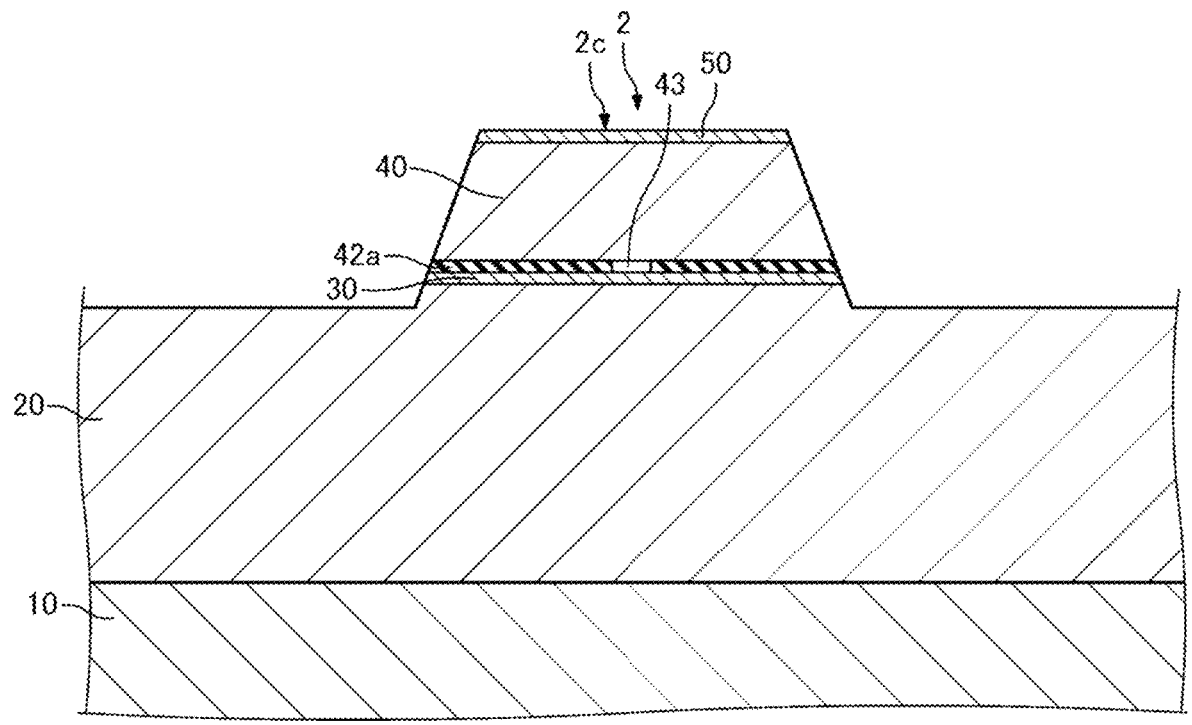
FIG. 8 is a sectional view schematically illustrating the manufacturing process of the semiconductor laser according to the first embodiment.

As illustrated in FIG. 8, the first region 60 and the second region 62 of the third part 2c are removed. The removal of the first region 60 and the second region 62 of the third part 2c is performed by, for example, dry etching using $CF_4$ gas, $CHF_3$ gas, $C_4F_8$ gas, or wet etching using hydrofluoric acid. In this process, for example, the first region 60 and the second region 62 of the first part 2a and the first region 60 and the second region 62 of the first part 2a may be covered with a mask layer, and the first region 60 and the second region 62 of the first part 2a and the first region 60 and the second region 62 of the first part 2a may be removed.

In wet etching using hydrofluoric acid, the oxidized layers 6 and 16 and the current confinement layer 42 are removed, and the unoxidized layers 4 and 14 are not removed. In this case, the unoxidized layers 4 and 14 are removed, for example, by wet etching using ammonia water.

Figure 9:
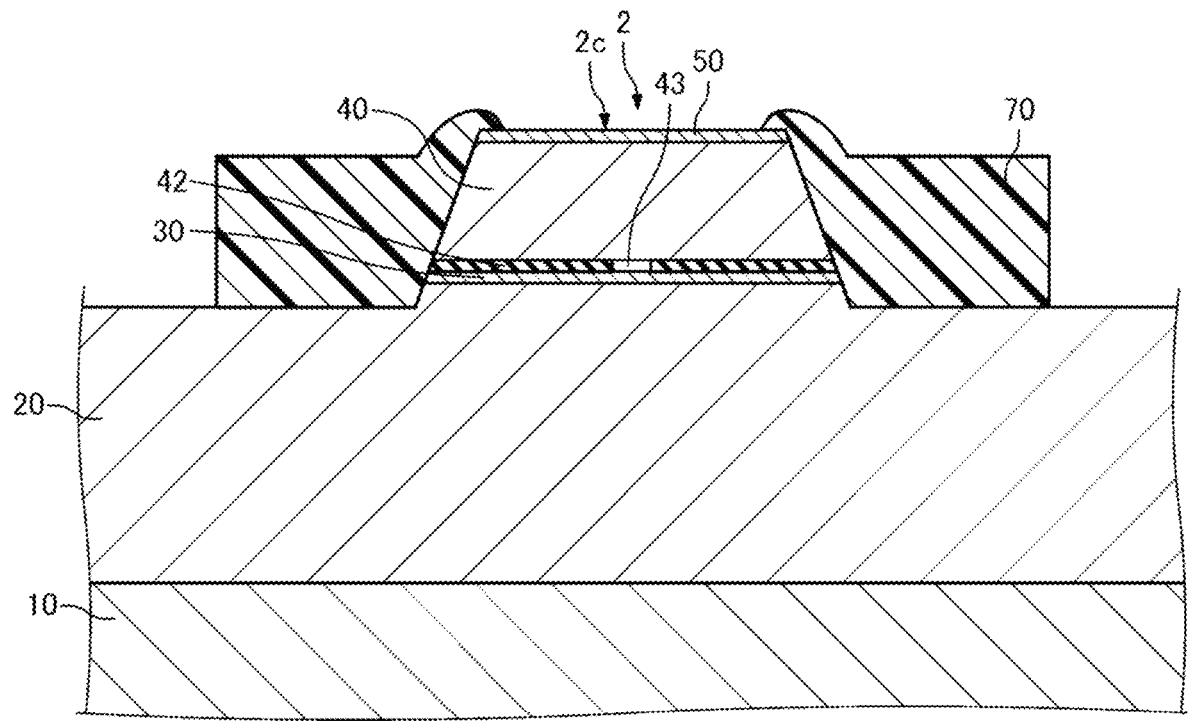
FIG. 9 is a sectional view schematically illustrating the manufacturing process of the semiconductor laser according to the first embodiment.

As illustrated in FIG. 9, the resin layer 70 is formed so as to surround the laminated body 2. The resin layer 70 is formed, for example, by forming a layer made of polyimide resin or the like on the upper surface of the first mirror layer 20 and the entire surface of the laminated body 2 by using a spin coating method or the like, and patterning the layer. The patterning is performed by, for example, photolithography and etching. Next, the resin layer 70 is hardened by heat treatment. By this heat treatment, the resin layer 70 shrinks. Furthermore, the resin layer 70 shrinks when the temperature is returned from the heat treatment to room temperature.

As illustrated in FIG. 2, the second electrode 82 is formed on the contact layer 50 and the resin layer 70, and the first electrode 80 is formed on the first mirror layer 20. The first electrode 80 and the second electrode 82 are formed by, for example, a combination of a vacuum deposition method and a lift-off method. An order of forming the first electrode 80 and the second electrode 82 is not particularly limited. Further, in the process of forming the second electrode 82, the pad 84 and the lead wiring 86 illustrated in FIG. 1 may be formed.

Through the processes above, the semiconductor laser 100 can be manufactured.

1.3. Effects

The semiconductor laser 100 has the following effects, for example.

In the semiconductor laser 100, in a plan view, when the width of the oxidized region 8 of the first part 2a is W1, the width of the oxidized region 8 of the second part 2b is W2, and the width of the oxidized region 8 of the third part 2c is W3, the relationship of the above-described expression (1) is satisfied at least at a part of the third part 2c. Therefore, in the semiconductor laser 100, compared to a case where the above-described expression (1) is not satisfied, the stress in a predetermined direction can be generated in the active layer 30 of the third part 2c by the first part 2a and the second part 2b while reducing the stress generated at the third part 2c by the oxidized region 8 of the third part 2c. Specifically, the stress in the direction from the third part 2c respectively toward the first part 2a and the second part 2b can be generated. Accordingly, it is possible to hold the polarized light of the emitted light while reducing the occurrence of defects at the third part 2c. Therefore, it is possible to prevent defects from occurring in the active layer of the third part 2c and the characteristics of the semiconductor laser 100, such as the wavelength or the amount of light, from changing, and to provide the semiconductor laser 100 having a long life and stable polarization.

For example, when the above-described expression (1) is not satisfied and W1=W2=W3 is satisfied, there is a case where dislocation occurs at the third part 2c due to the stress caused by the oxidized region 8 of the third part 2c.

In contrast, in the semiconductor laser 100 of the embodiment, W3=0 is satisfied. Therefore, in the semiconductor laser 100, compared to a case where the third part 2c does not have a part where W3=0 is satisfied, the stress generated at the third part 2c by the oxidized region 8 of the third part 2c can be reduced.

1.4. Modification Example of Semiconductor Laser

1.4.1. First Modification Example

Figure 10:
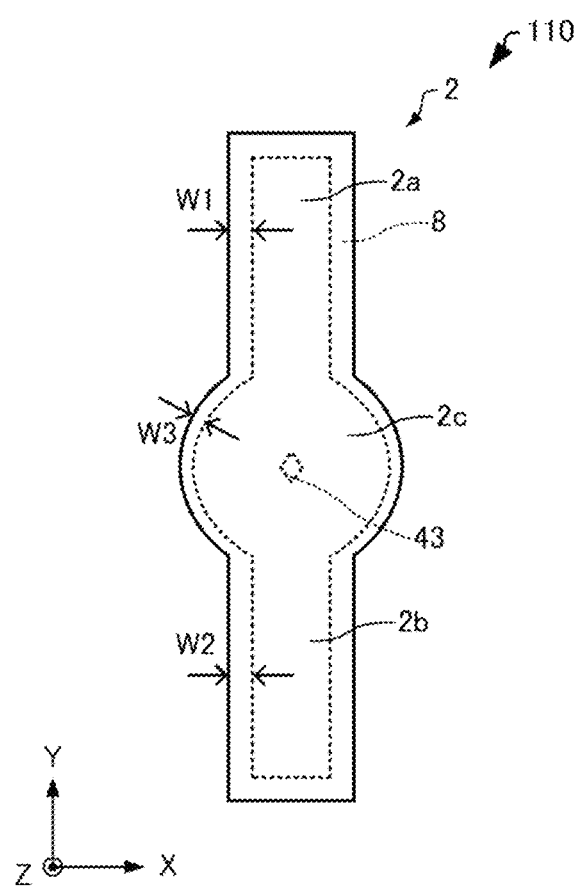
FIG. 10 is a plan view schematically illustrating a semiconductor laser according to a first modification example of the first embodiment.

Next, the semiconductor laser according to a first modification example of the first embodiment will be described with reference to the drawings. FIG. 10 is a plan view schematically illustrating a semiconductor laser 110 according to the first modification example of the first embodiment. For convenience, illustration of members other than the laminated body 2 is omitted in FIG. 10.

Hereinafter, in the semiconductor laser 110 according to the first modification example of the first embodiment, points different from the example of the semiconductor laser 100 according to the above-described first embodiment will be described, the same points will be given the same reference numerals, and the description thereof will be omitted. This is the same in the semiconductor laser according to second and third modification examples, which will be described later, of the first embodiment.

In the above-described semiconductor laser, W3=0 is satisfied as illustrated in FIG. 3.

In contrast, in the semiconductor laser 110, W3>0 is satisfied as illustrated in FIG. 10. In other words, the side surface of the third part 2c is constituted with the oxidized region 8. Since the semiconductor laser 110 satisfies the expression (1), the stress generated at the third part 2c by the oxidized region 8 of the third part 2c can be reduced.

In the semiconductor laser 110, W3>0 is satisfied. Therefore, when the oxidized region 8 of the third part 2c is removed, for example, even when the oxidized layers 6 and 16 are removed by wet etching using hydrofluoric acid and the unoxidized layers 4 and 14 are not removed, compared to a case where W3=0 is satisfied, a possibility that the unoxidized layers 4 and 14 are broken can be reduced.

1.4.2. Second Modification Example

Figure 11:
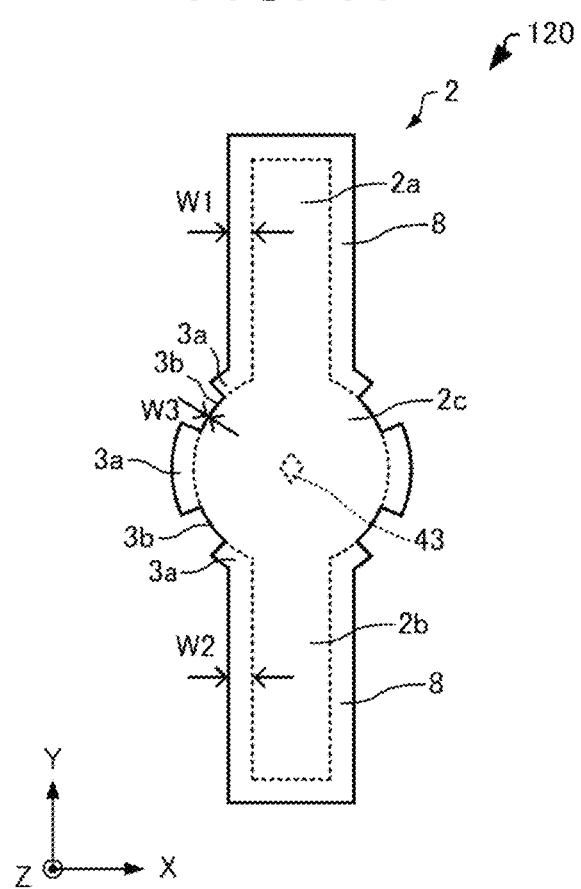
FIG. 11 is a plan view schematically illustrating a semiconductor laser according to a second modification example of the first embodiment.

Next, the semiconductor laser according to a second modification example of the first embodiment will be described with reference to the drawings. FIG. 11 is a plan view schematically illustrating a semiconductor laser 120 according to the second modification example of the first embodiment. For convenience, illustration of members other than the laminated body 2 is omitted in FIG. 11.

As illustrated in FIG. 11, in a plan view, the semiconductor laser 120 is different from the above-described semiconductor laser 120 in that the part 3a of which the side surface is constituted with the oxidized region 8 is disposed on one side and the other side with respect to the opening 43 along the X axis. The position of the part 3a is not particularly limited. Since the semiconductor laser 120 has the part 3b where W3=0 is satisfied, the expression (1) is satisfied, and the stress generated at the third part 2c by the oxidized region 8 of the third part 2c can be reduced.

1.4.3. Third Modification Example

Figure 12:
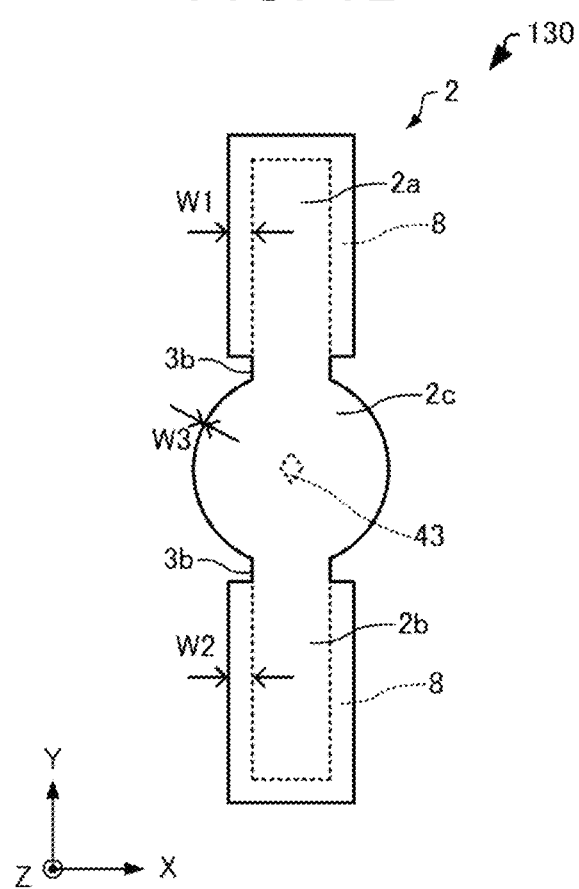
FIG. 12 is a plan view schematically illustrating a semiconductor laser according to a third modification example of the first embodiment.

Next, the semiconductor laser according to a third modification example of the first embodiment will be described with reference to the drawings. FIG. 12 is a plan view schematically illustrating a semiconductor laser 130 according to the third modification example of the first embodiment. For convenience, illustration of members other than the laminated body 2 is omitted in FIG. 12.

In the above-described semiconductor laser 100, as illustrated in FIG. 3, the third part 2c has the part 3a of which the side surface is constituted with the oxidized region 8.

In contrast, in the semiconductor laser 130, as illustrated in FIG. 12, the third part 2c does not have the part 3a of which the side surface is constituted with the oxidized region 8. In other words, the third part 2c does not have the oxidized region 8. In the semiconductor laser 130, the entire third part 2c satisfies the relationship of the expression (1). In the illustrated example, the first part 2a and the second part 2b have the part 3b of which the side surface is not constituted with the oxidized region 8.

In the semiconductor laser 130, the entire third part 2c satisfies the relationship of the expression (1). Therefore, in the semiconductor laser 130, compared to a case where the relationship of the expression (1) is satisfied only at a part of the third part 2c, the stress generated at the third part 2c by the oxidized region 8 of the third part 2c can be reduced.

2. Second Embodiment

2.1. Semiconductor Laser

Next, a semiconductor laser according to a second embodiment will be described with reference to the drawings.

Figure 13:
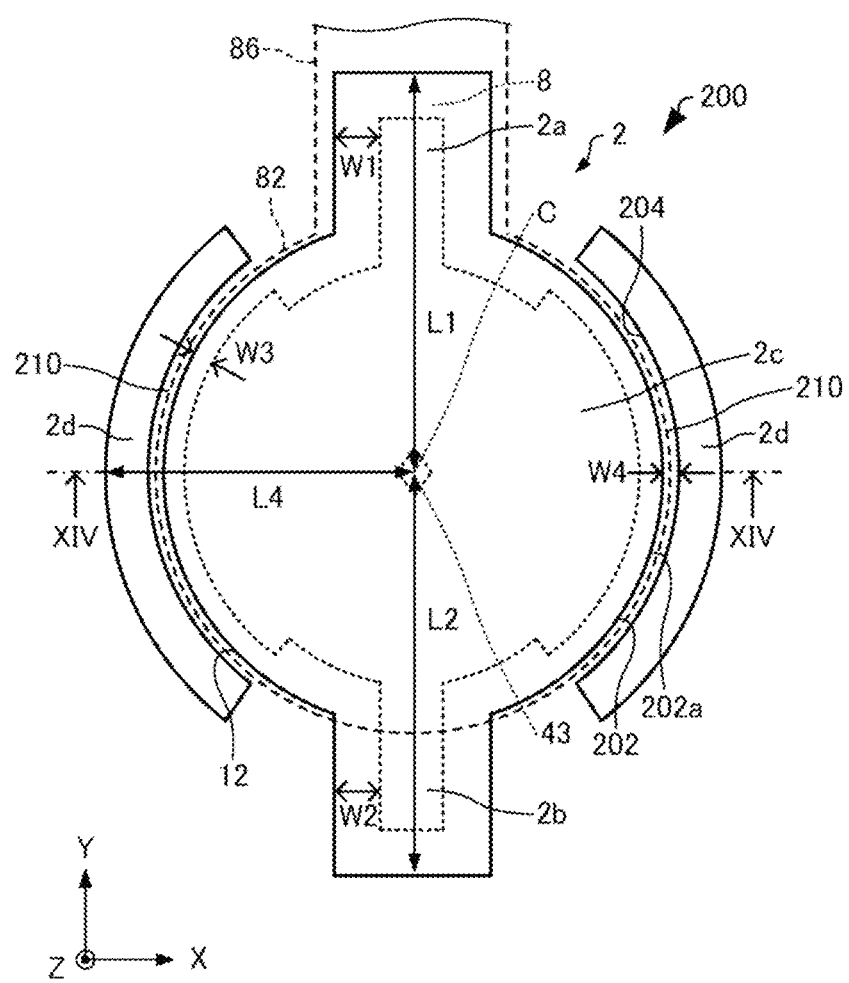
FIG. 13 is a plan view schematically illustrating a semiconductor laser according to a second embodiment.
Figure 14:
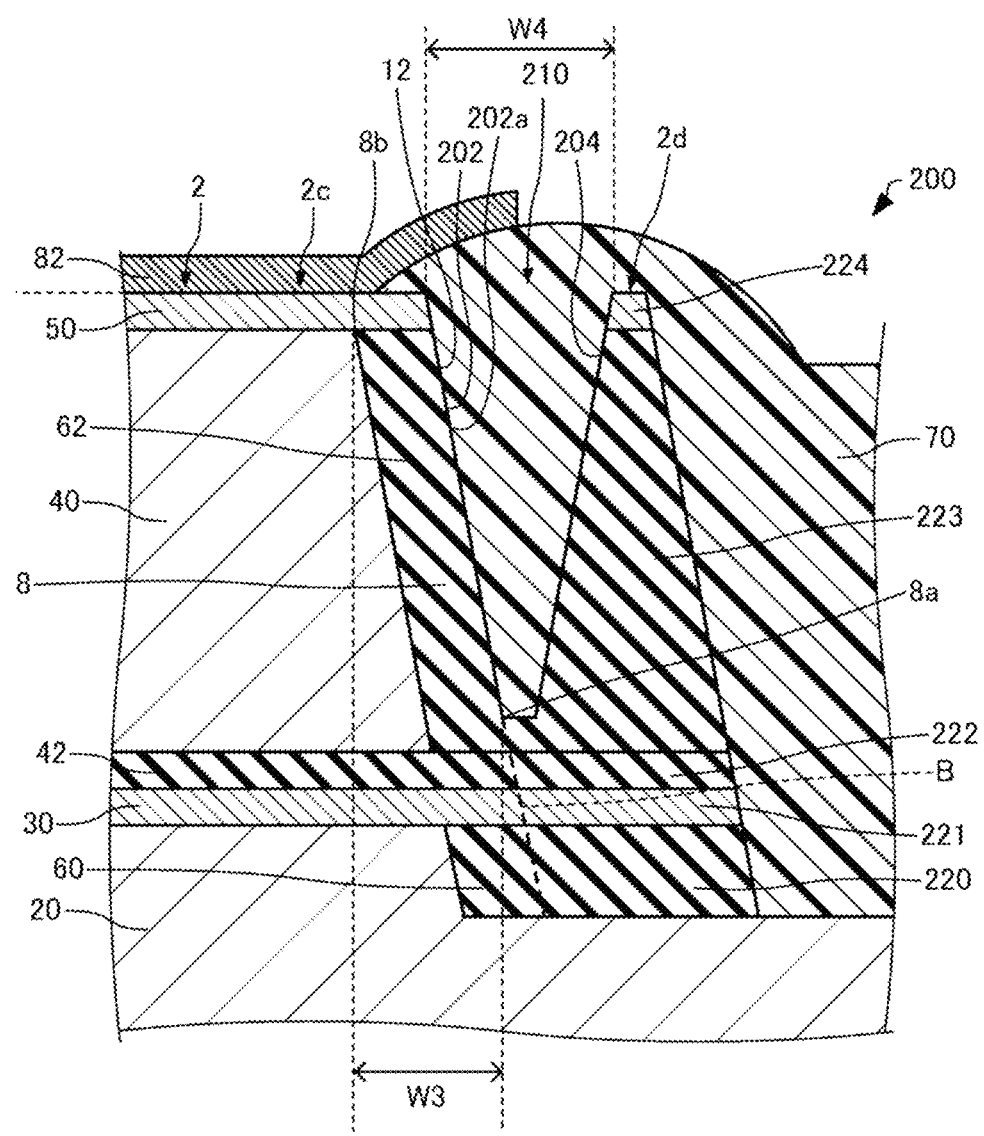
FIG. 14 is a sectional view schematically illustrating the semiconductor laser according to the second embodiment.

FIG. 13 is a plan view schematically illustrating a semiconductor laser 200 according to the second embodiment. FIG. 14 is a sectional view taken along the line XIV-XIV of FIG. 13, schematically illustrating the semiconductor laser 200 according to the second embodiment. For convenience, illustration of members other than the laminated body 2, the second electrode 82, and the lead wiring 86 is omitted in FIG. 13. In FIG. 13, the second electrode 82 and the lead wiring are illustrated in a transparent manner, the second electrode 82 and the lead wiring 86 are indicated by a broken line, and the oxidized region 8 is indicated by a dotted line, respectively.

Hereinafter, in the semiconductor laser 200 according to the second embodiment, points different from the example of the semiconductor laser 100 according to the above-described first embodiment will be described, the same points will be given the same reference numerals, and the description thereof will be omitted.

As illustrated in FIGS. 13 and 14, the semiconductor laser 200 is different from the above-described semiconductor laser 100 in that the laminated body 2 has a fourth part 2d.

A gap 210 is provided between a first side surface 202 of the third part 2c and a second side surface 204 of the fourth part 2d. The first side surface 202 constitutes a part of the side surface 12 of the laminated body 2. In the example illustrated in FIG. 14, the first side surface 202 and the second side surface 204 are in contact with the resin layer 70. The gap 210 is filled with the resin layer 70, for example.

The semiconductor laser 200 satisfies the relationship of the expression (1) at a part 202a that faces the gap 210 of the first side surface 202. A maximum width W4 of the gap 210 is, for example, 2 μm or less, preferably 0.5 μm or less. The width W4 of the gap 210 is constant along the first side surface 202, for example.

For example, the third part 2c and the fourth part 2d are partially in contact with each other. As illustrated in FIG. 14, at the part where the third part 2c and the fourth part 2d are in contact with each other, a boundary B between the third part 2c and the fourth part 2d is positioned on a virtual plane including the first side surface 202. In the illustrated example, the ends 8a and 8b of the oxidized region 8 are constituted with the second region 62. In other words, the width W3 of the oxidized region 8 of the third part 2c is the width of the part of the oxidized region 8 of the third part 2c that faces the gap 210. In the illustrated example, the width of the first region 60 of the third part 2c and the width of the second region 62 are the same as each other. Although not illustrated, the width of the first region 60 and the width of the second region 62 may be different from each other.

The fourth part 2d includes, for example, a first layer 220, a second layer 221, an oxidized layer 222, a third layer 223, and a fourth layer 224.

The first layer 220 is disposed over the first mirror layer 20. The first layer 220 is continuous with the first region 60 of the third part 2c. The material of the first layer 220 is the same as that of the first region 60.

The second layer 221 is disposed over the first layer 220. The second layer 221 is continuous with the active layer 30 of the third part 2c. The material of the second layer 221 is the same as that of the active layer 30.

The oxidized layer 222 is disposed over the second layer 221. The oxidized layer 222 is continuous with the current confinement layer 42 of the third part 2c. The material of the oxidized layer 222 is the same as that of the current confinement layer 42.

The third layer 223 is disposed over the oxidized layer 222. The third layer 223 is continuous with a part of the second region 62 of the third part 2c. The material of the third layer 223 is the same as that of the second region 62.

The fourth layer 224 is disposed over the third layer 223. The fourth layer 224 is separated from the contact layer 50 of the third part 2c. The material of the fourth layer 224 is the same as that of the contact layer 50.

The height of the third part 2c and the height of the fourth part 2d are, for example, the same as each other. Accordingly, since a part of the force generated by the shrinkage of the resin layer 70 is applied to the fourth part 2d, the stress generated at the third part 2c by the resin layer 70 can be reduced. Furthermore, the third part 2c and the fourth part 2d can be formed in the same process. In addition, the fourth part 2d may be lower than the third part 2c. Accordingly, the uniformity of the stress generated at the third part 2c by the resin layer 70 can be improved.

The second electrode 82 does not overlap the fourth part 2d in a plan view. Therefore, compared to a case where the second electrode 82 overlaps the fourth part 2d in a plan view, a region where the heat is transmitted to the resin layer 70 can be reduced even when the second electrode 82 generates heat. Accordingly, the stress generated at the third part 2c by the resin layer 70 can be further reduced.

In the example illustrated in FIG. 13, two fourth parts 2d are provided. The two fourth parts 2d are provided symmetrically with respect to a virtual axis that passes through a center C of the opening 43 and is parallel to the Y axis, for example, in a plan view. In addition, the number, the length, and the width of the fourth part 2d are not particularly limited.

A distance L1 between apart farthest from the center C of the first part 2a and the center C, and a distance L2 between a part farthest from the center C of the second part 2b and the center C, are greater than a distance L4 between the part farthest from the center C of the fourth part 2d and the center C. Therefore, even when the fourth part 2d is provided, the anisotropy of stress generated in the active layer 30 by the first part 2a and the second part 2b can be held, and the polarized light of the emitted light can be held.

2.2. Manufacturing Method of Semiconductor Laser

Figure 15:
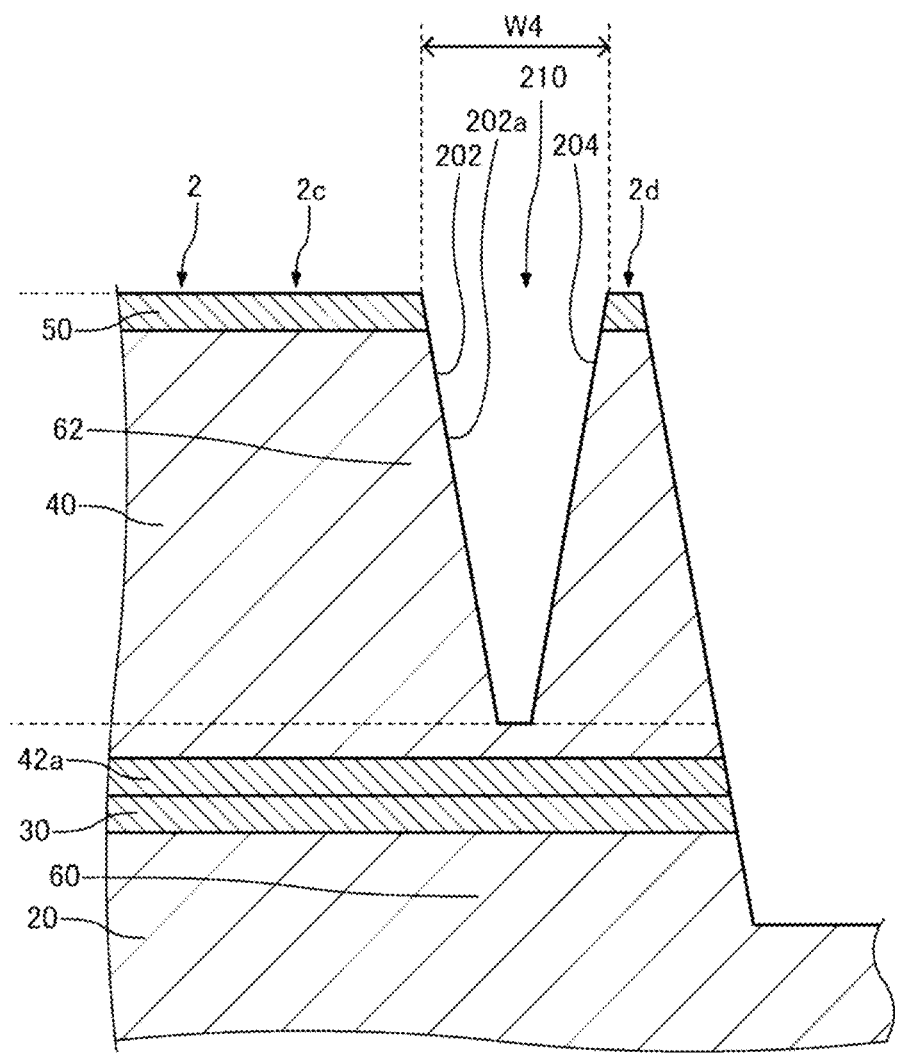
FIG. 15 is a sectional view schematically illustrating a manufacturing process of the semiconductor laser according to the second embodiment.

Next, a manufacturing method of the semiconductor laser 200 according to the second embodiment will be described with reference to the drawings. FIG. 15 is a sectional view schematically illustrating a manufacturing process of the semiconductor laser 200 according to the second embodiment.

Hereinafter, in the manufacturing method of the semiconductor laser 200 according to the second embodiment, points different from the example of the manufacturing method of the semiconductor laser 100 according to the above-described first embodiment will be described, the same points will be given the same reference numerals, and the description thereof will be omitted.

In the manufacturing method of the semiconductor laser 200, when the contact layer 50, the second mirror layer 40, the to-be-oxidized layer 42a, the active layer 30, and the first mirror layer 20 are patterned to form the laminated body 2, as illustrated in FIG. 15, the fourth part 2d is formed. The patterning is performed by photolithography and dry etching.

Here, since the width W4 of the gap 210 between the third part 2c and the fourth part 2d is as narrow as 2 µm or less, the etching gas is not sufficiently supplied between the third part 2c and the fourth part 2d, and the etching rate is slow. Therefore, the gap 210 that does not reach the to-be-oxidized layer 42a can be formed. In this manner, in the manufacturing method of the semiconductor laser 200, the fourth part 2d can be formed without increasing the number of processes for forming the fourth part 2d.

In the process of forming the current confinement layer 42 by putting the substrate 10 provided with the laminated body 2 in a water vapor atmosphere at substantially 400° C., the width W4 of the gap 210 is as narrow as 2 µm or less, and as illustrated in FIG. 14, moisture is not sufficiently supplied between the third part 2c and the fourth part 2d. Therefore, the width of the second region 62 is smaller at the part 202a that faces the gap 210 of the first side surface 202 than that at the part that does not face the gap 210 of the first side surface 202.

2.3. Effects

The semiconductor laser 200 has the following effects, for example.

In the semiconductor laser 200, the laminated body 2 has the fourth part 2d, is provided with the gap 210 between the first side surface 202 of the third part 2c and the second side surface 204 of the fourth part 2d, and satisfies the relationship of the expression (1) at the part 202a that faces the gap 210 of the first side surface 202. Therefore, the stress generated at the third part 2c by the oxidized region 8 of the third part 2c can be reduced.

In the semiconductor laser 200, the fourth part 2d has the oxidized layer 222, and the current confinement layer 42 and the oxidized layer 222 are continuous with each other. Therefore, moisture is supplied to the to-be-oxidized layer 42a from the side surface of the fourth part 2d, and the opening 43 having a desired shape can be formed even when the gap 210 is provided.

3. Third Embodiment

3.1. Semiconductor Laser

Figure 16:
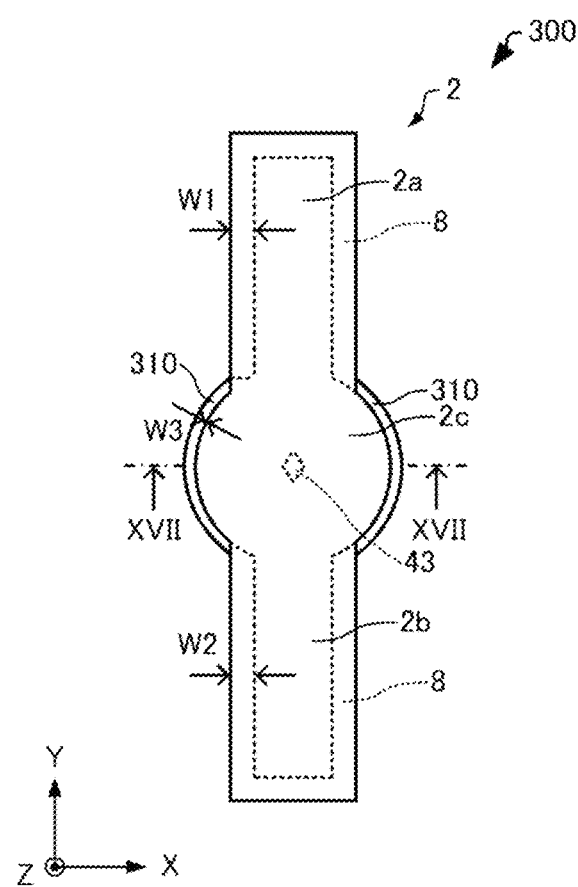
FIG. 16 is a plan view schematically illustrating a semiconductor laser according to a third embodiment.
Figure 17:
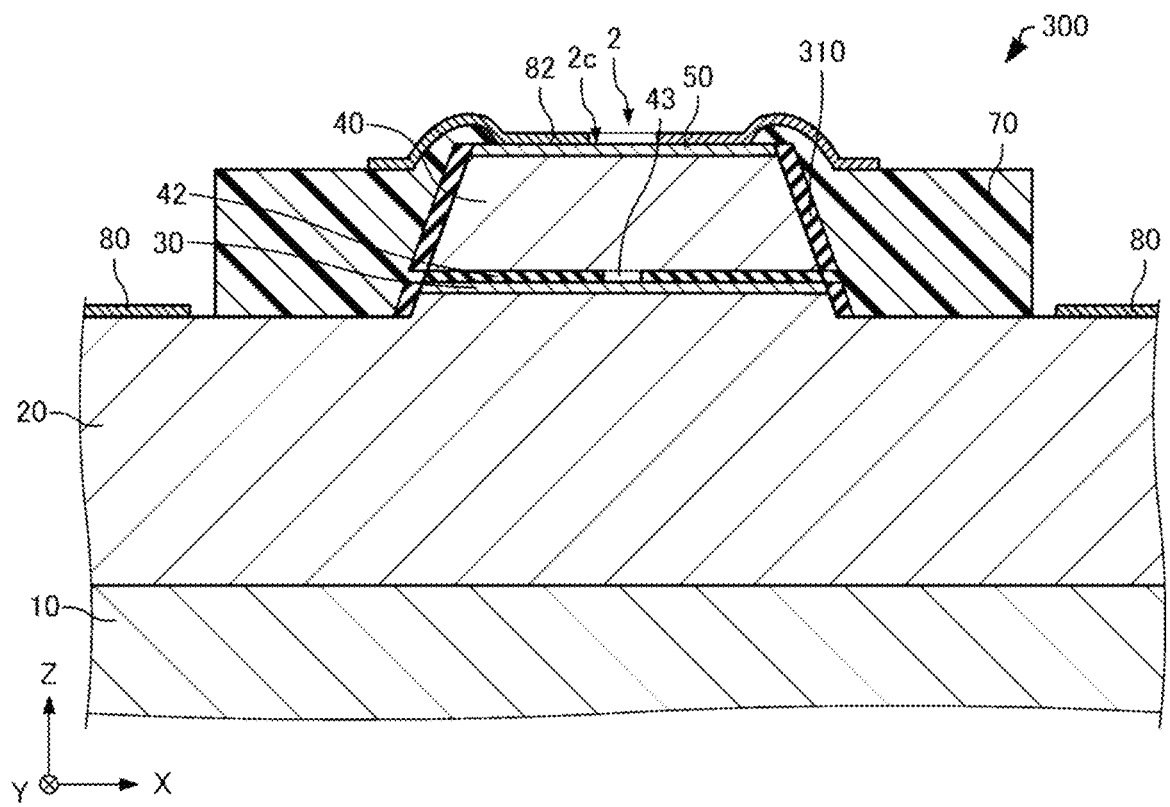
FIG. 17 is a sectional view schematically illustrating the semiconductor laser according to the third embodiment.

Next, a semiconductor laser according to a third embodiment will be described with reference to the drawings. FIG. 16 is a plan view schematically illustrating a semiconductor laser 300 according to the third embodiment. FIG. 17 is a sectional view taken along the line XVII-XVII of FIG. 16, schematically illustrating the semiconductor laser 300 according to the third embodiment. For convenience, illustration of members other than the laminated body 2 and a coating layer 310 is omitted in FIG. 16.

Hereinafter, in the semiconductor laser 300 according to the third embodiment, points different from the example of the semiconductor laser 100 according to the above-described first embodiment will be described, the same points will be given the same reference numerals, and the description thereof will be omitted.

As illustrated in FIGS. 16 and 17, the semiconductor laser 300 differs from the above-described semiconductor laser 100 in that the coating layer 310 is provided.

The coating layer 310 covers a part of the side surface of the third part 2c. As illustrated in FIG. 16, the coating layer 310 does not cover the first part 2a and the second part 2b. As illustrated in FIG. 17, the coating layer 310 does not cover the current confinement layer 42. In the illustrated example, the coating layer 310 covers the entire side surface of the third part 2c other than the side surface of the current confinement layer 42. In the semiconductor laser 300, at the part of the third part 2c covered with the coating layer 310, the relationship of the expression (1) is satisfied.

The coating layer 310 is, for example, an aluminum oxidized layer, a hafnium oxidized layer, a silicon oxidized layer, a silicon nitride layer, a silicon oxynitride layer, or the like. The coating layer 310 has lower oxygen permeability than that of the first mirror layer 20 and the second mirror layer 40. The coating layer 310 may be in a passive state formed by putting the third part 2c into a chamber heated to, for example, 350° C. and flowing nitrogen gas.

3.2. Manufacturing Method of Semiconductor Laser

Figure 18:
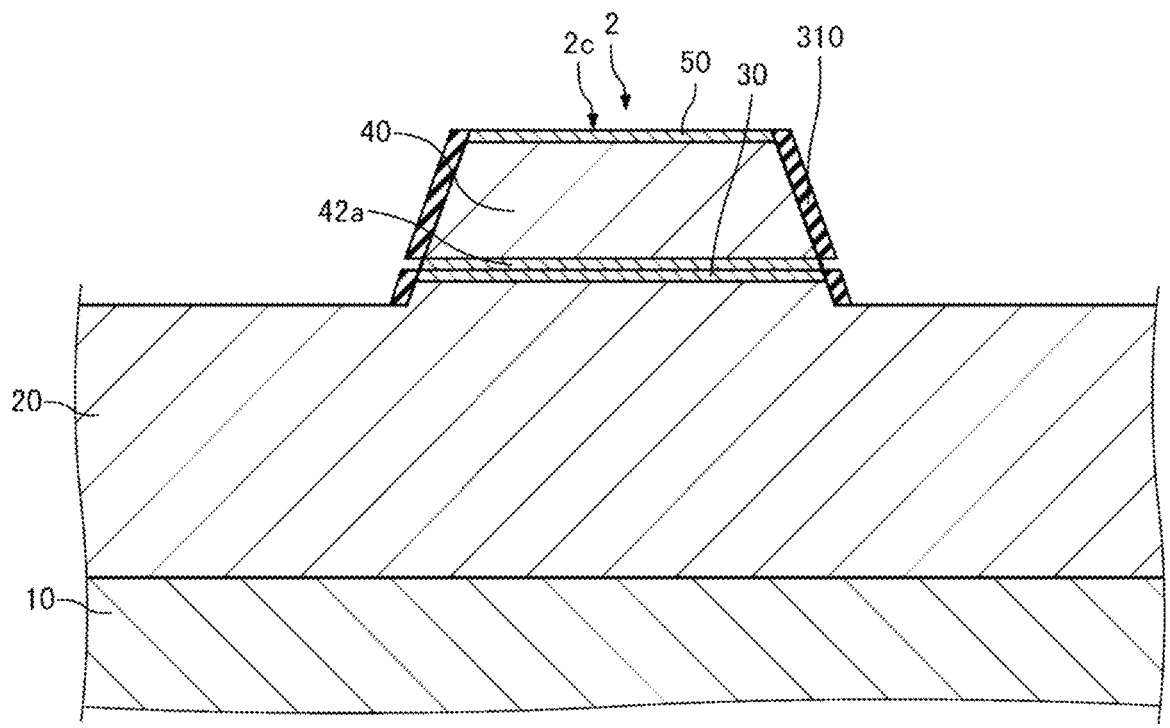
FIG. 18 is a sectional view schematically illustrating a manufacturing process of the semiconductor laser according to the third embodiment.

Next, a manufacturing method of the semiconductor laser 300 according to the third embodiment will be described with reference to the drawings. FIG. 18 is a sectional view schematically illustrating a manufacturing process of the semiconductor laser 300 according to the third embodiment.

Hereinafter, in the manufacturing method of the semiconductor laser 300 according to the third embodiment, points different from the example of the manufacturing method of the semiconductor laser 100 according to the above-described first embodiment will be described, the same points will be given the same reference numerals, and the description thereof will be omitted.

In the manufacturing method of the semiconductor laser 300, after the contact layer 50, the second mirror layer 40, the to-be-oxidized layer 42a, the active layer 30, and the first mirror layer 20 are patterned to form the laminated body 2, as illustrated in FIG. 18, the coating layer 310 is formed at apart of the side surface of the third part 2c. The coating layer 310 is formed so as not to cover the to-be-oxidized layer 42a.

The coating layer 310 is formed by, for example, film formation by an atomic layer deposition (ALD) method or a chemical vapor deposition (CVD) method, and by patterning by photolithography and etching. Photolithography is performed using, for example, an electron beam exposure apparatus. Since the side surface of the third part 2c is inclined with respect to the upper surface of the substrate 10, it is easy to pattern into a desired shape.

Next, in the process of forming the current confinement layer 42 by putting the substrate 10 provided with the laminated body 2 in a water vapor atmosphere at substantially 400° C., the oxygen permeability of the coating layer 310 is low, and thus, as illustrated in FIG. 17, the first mirror layer 20 and the second mirror layer 40 are not oxidized, for example, at the part where the coating layer 310 is provided.

3.3. Effects

The semiconductor laser 300 has the following effects, for example.

In the semiconductor laser 300, at the part including the coating layer 310 that covers a part of the third part 2c and is covered by the coating layer 310 at the third part 2c, the relationship of the expression (1) is satisfied. Therefore, in the semiconductor laser 300, the expression (1) can be satisfied without providing the process of removing the oxidized region 8 of the third part 2c.

4. Fourth Embodiment

Figure 19:
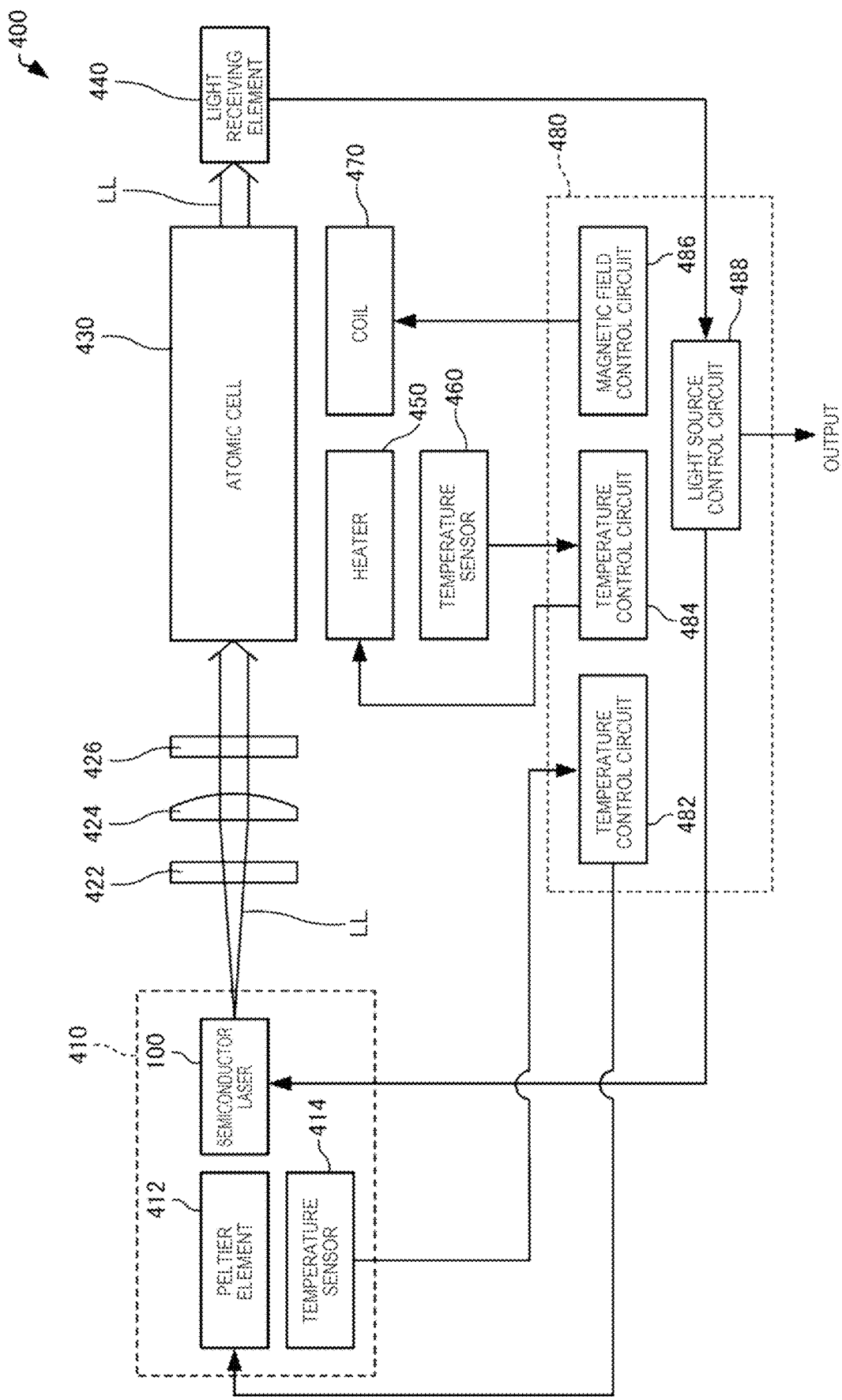
FIG. 19 is a view illustrating a configuration of an atomic oscillator according to a fourth embodiment.

Next, an atomic oscillator according to a fourth embodiment will be described with reference to the drawings. FIG. 19 is a view illustrating a configuration of an atomic oscillator 400 according to the fourth embodiment.

The atomic oscillator 400 is an atomic oscillator that uses a quantum interference effect (CPT: coherent population trapping) that causes a phenomenon in which, when an alkali metal atom is irradiated simultaneously with two rays of resonant light having specific different wavelengths, the two rays of resonant light are transmitted without being absorbed by the alkali metal atom. The phenomenon due to the quantum interference effect is also called an electromagnetically induced transparency (EIT) phenomenon. Further, the atomic oscillator according to the present disclosure may be an atomic oscillator using a double resonance phenomenon by light and microwave.

The atomic oscillator 400 includes the semiconductor laser 100 according to the first embodiment.

As illustrated in FIG. 19, the atomic oscillator 400 includes a light emitting element module 410, a neutral density filter 422, a lens 424, a quarter wavelength plate 426, an atom cell 430, a light receiving element 440, a heater 450, a temperature sensor 460, a coil 470, and a control circuit 480.

The light emitting element module 410 includes a semiconductor laser 100, a Peltier element 412, and a temperature sensor 414. The semiconductor laser 100 emits linearly polarized light LL including two types of light having different frequencies. The temperature sensor 414 detects the temperature of the semiconductor laser 100. The Peltier element 412 controls the temperature of the semiconductor laser 100.

The neutral density filter 422 reduces the intensity of the light LL emitted from the semiconductor laser 100. The lens 424 adjusts a radiation angle of the light LL. Specifically, the lens 424 changes the light LL into parallel light. The quarter wavelength plate 426 converts two types of light having different frequencies included in the light LL from linearly polarized light to circularly polarized light.

The atom cell 430 is irradiated with the light emitted from the semiconductor laser 100. The atom cell 430 transmits the light LL emitted from the semiconductor laser 100. The atom cell 430 contains alkali metal atoms. The alkali metal atom has a three-level energy level constituted with two different ground levels and excited levels. The light LL emitted from the semiconductor laser 100 is incident on the atom cell 430 via the neutral density filter 422, the lens 424, and the quarter wavelength plate 426.

The light receiving element 440 detects the intensity of the excitation light LL transmitted through the atom cell 430 and outputs a detection signal that corresponds to the intensity of the light. As the light receiving element 440, for example, a photodiode can be used.

The heater 450 controls the temperature of the atom cell 430. The heater 450 heats the alkali metal atoms contained in the atom cell 430 to make at least apart of the alkali metal atoms into a gas state.

The temperature sensor 460 detects the temperature of the atom cell 430. The coil 470 generates a magnetic field that causes Zeeman splitting of a plurality of degenerated energy levels of alkali metal atoms in the atom cell 430. The coil 470 can improve the resolution by widening a gap between different energy levels in which the alkali metal atoms are degenerated by Zeeman splitting. As a result, the accuracy of the oscillation frequency of the atomic oscillator 400 can be improved.

The control circuit 480 includes a temperature control circuit 482, a temperature control circuit 484, a magnetic field control circuit 486, and a light source control circuit 488.

The temperature control circuit 482 controls energization to the Peltier element 412 based on the detection result of the temperature sensor 414 such that the temperature of the semiconductor laser 100 reaches a desired temperature. The temperature control circuit 484 controls energization to the heater 450 based on the detection result of the temperature sensor 460 such that the inside of the atom cell 430 reaches a desired temperature. The magnetic field control circuit 486 controls energization to the coil 470 such that the magnetic field generated by the coil 470 is constant.

The light source control circuit 488 controls the frequencies of the two types of light included in the light LL emitted from the semiconductor laser 100 based on the detection result of the light receiving element 440 such that the EIT phenomenon occurs. Here, when the two types of light become resonant light pairs having a frequency difference that corresponds to the energy difference between the two ground levels of the alkali metal atoms contained in the atom cell 430, the EIT phenomenon occurs. The light source control circuit 488 includes a voltage controlled oscillator of which oscillation frequency is controlled so as to be stabilized in synchronization with the control of two types of light frequencies, and outputs an output signal of the voltage controlled oscillator (VCO) as a clock signal of the atomic oscillator 400.

The control circuit 480 is provided, for example, on an integrated circuit (IC) chip mounted on a substrate (not illustrated). The control circuit 480 may be a single IC or a combination of a plurality of digital circuits or analog circuits.

The application of the semiconductor laser 100 is not limited to the light source of the atomic oscillator. The semiconductor laser 100 may be used as a laser for communication or distance measurement, for example.

5. Fifth Embodiment

Figure 20:
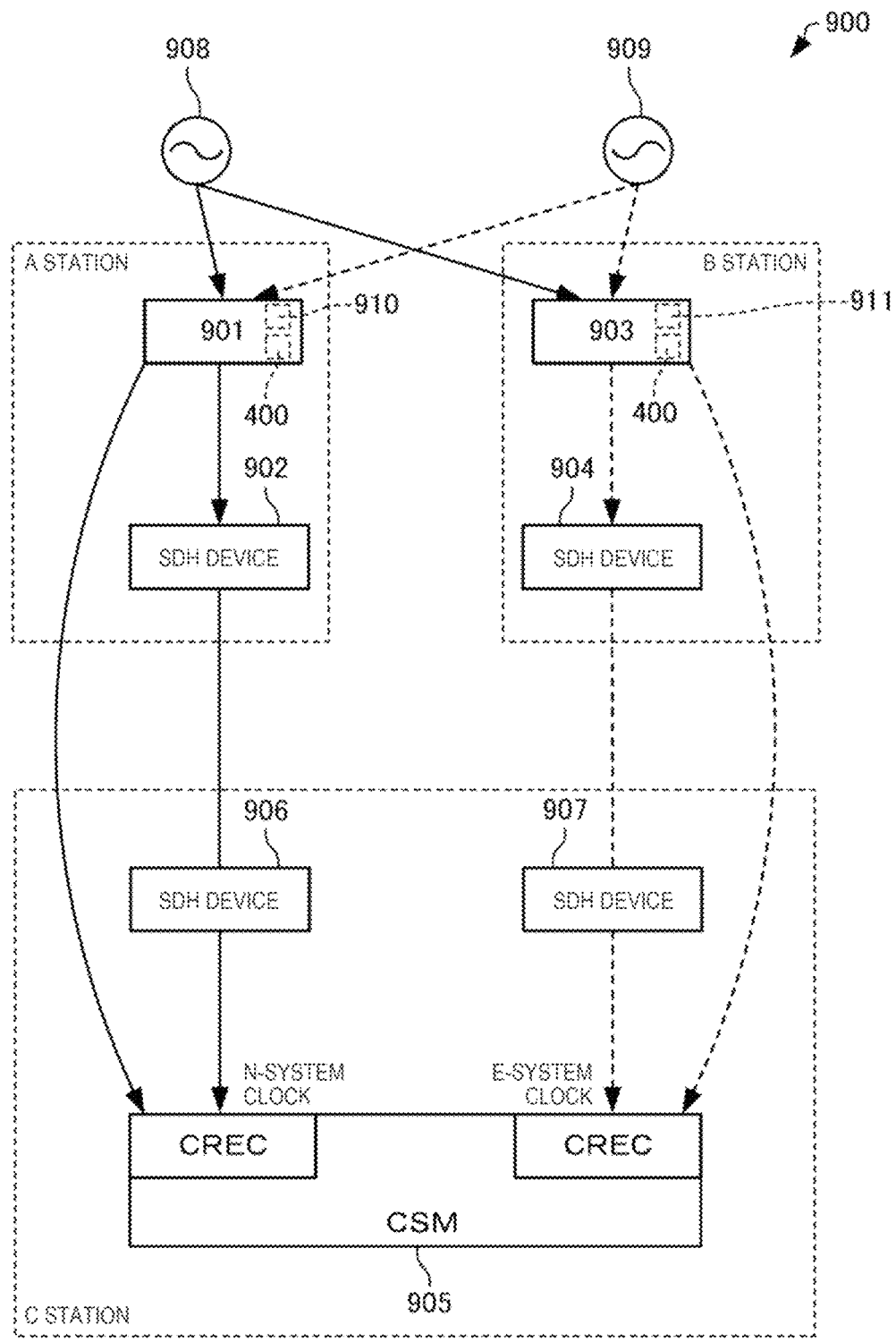
FIG. 20 is a view for describing an example of a frequency signal generation system according to a fifth embodiment.

Next, a frequency signal generation system according to a fifth embodiment will be described with reference to the drawings. The following clock transmission system as a timing server is an example of the frequency signal generation system. FIG. 20 is a schematic configuration view illustrating a clock transmission system 900.

The clock transmission system 900 includes an atomic oscillator 400 according to the fourth embodiment.

The clock transmission system 900 is a system that matches the clocks of each device in the time division multiplexing network, and has a redundant configuration of a normal (N) system and an emergency (E) system.

As illustrated in FIG. 20, the clock transmission system 900 includes a clock supply device 901 and a synchronous digital hierarchy (SDH) device 902 of an A station, a clock supply device 903 and an SDH device 904 of a B station, and a clock supply device 905 and SDH devices 906 and 907 of a C station. The clock supply device 901 includes the atomic oscillator 400 and generates an N-system clock signal. The clock supply device 901 has a terminal 910 to which a frequency signal from the atomic oscillator 400 is input. The atomic oscillator 400 in the clock supply device 901 generates a clock signal in synchronization with a more accurate clock signal from master clocks 908 and 909 including an atomic oscillator using cesium.

The SDH device 902 transmits and receives a main signal based on the clock signal from the clock supply device 901, superimposes the N-system clock signal on the main signal, and transmits the superimposed signal to the clock supply device 905 of the lower level. The clock supply device 903 includes the atomic oscillator 400 and generates an E-system clock signal. The clock supply device 903 has a terminal 911 to which a frequency signal from the atomic oscillator 400 is input. The atomic oscillator 400 in the clock supply device 903 generates a clock signal in synchronization with a more accurate clock signal from master clocks 908 and 909 including an atomic oscillator using cesium.

The SDH device 904 transmits and receives the main signal based on the clock signal from the clock supply device 903, superimposes the E-system clock signal on the main signal, and transmits the superimposed signal to the clock supply device 905 of the lower level. The clock supply device 905 receives the clock signal from the clock supply devices 901 and 903 and generates a clock signal in synchronization with the received clock signal.

The clock supply device 905 normally generates a clock signal in synchronization with the N-system clock signal from the clock supply device 901. When an abnormality occurs in the N system, the clock supply device 905 generates a clock signal in synchronization with the E-system clock signal from the clock supply device 903. By switching from the N system to the E system in this manner, stable clock supply can be ensured and the reliability of the clock path network can be improved. The SDH device 906 transmits and receives the main signal based on the clock signal from the clock supply device 905. Similarly, the SDH device 907 transmits and receives the main signal based on the clock signal from the clock supply device 905. Accordingly, the apparatus of the C station can be synchronized with the apparatus of the A station or the B station.

The frequency signal generation system according to the fifth embodiment is not limited to the clock transmission system. The frequency signal generation system includes a system constituted with various devices and a plurality of devices on which the atomic oscillator is mounted and the frequency signal of the atomic oscillator is used. The frequency signal generation system includes a controller that controls the atomic oscillator.

The frequency signal generation system according to the fifth embodiment may be, for example, a smartphone, a tablet terminal, a timepiece, a mobile phone, a digital still camera, a liquid ejection device such as an ink jet printer, a personal computer, a television, a video camera, a videotape recorder, a car navigation device, a pager, an electronic notebook, an electronic dictionary, a calculator, an electronic game device, a word processor, a workstation, a video phone, a crime prevention TV monitor, an electronic binoculars, a point of sales (POS) terminal, medical equipment, a fish finder, a global navigation satellite system (GNSS) frequency standard, various measuring instruments, a meter, a flight simulator, a digital terrestrial broadcasting system, a mobile phone base station, or a moving object.

Examples of the medical equipment include an electronic thermometer, a sphygmomanometer, a blood glucose meter, an electrocardiogram measuring device, an ultrasonic diagnostic device, an electronic endoscope, and a magnetocardiograph. Examples of the meter include meters of automobiles, airplanes, and ships. Examples of the moving object include automobiles, airplanes, and ships.

6. Examples and Comparative Examples

Examples and comparative examples will be illustrated and described below.

Figure 21:
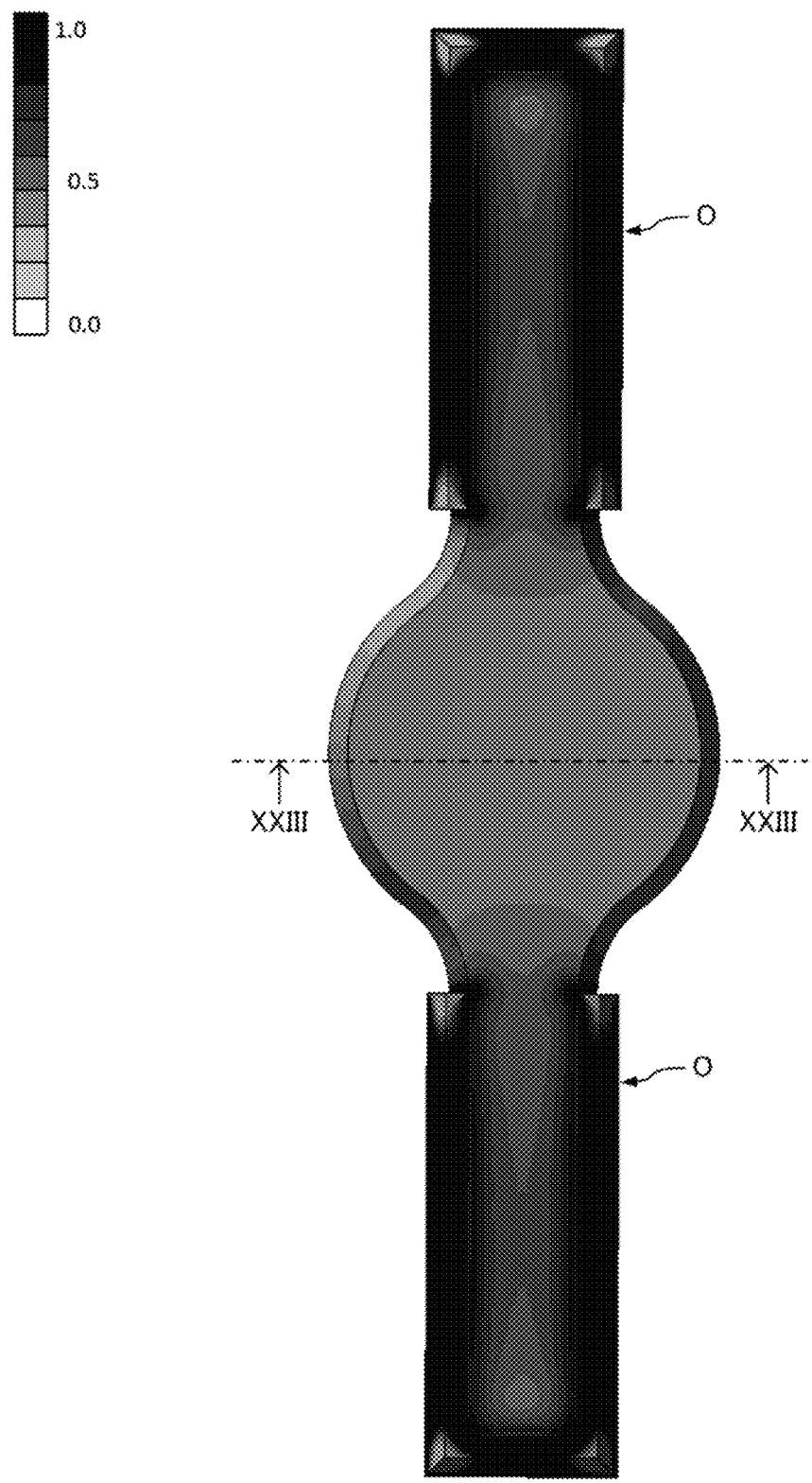
FIG. 21 illustrates a simulation result of Example 1.
Figure 22:
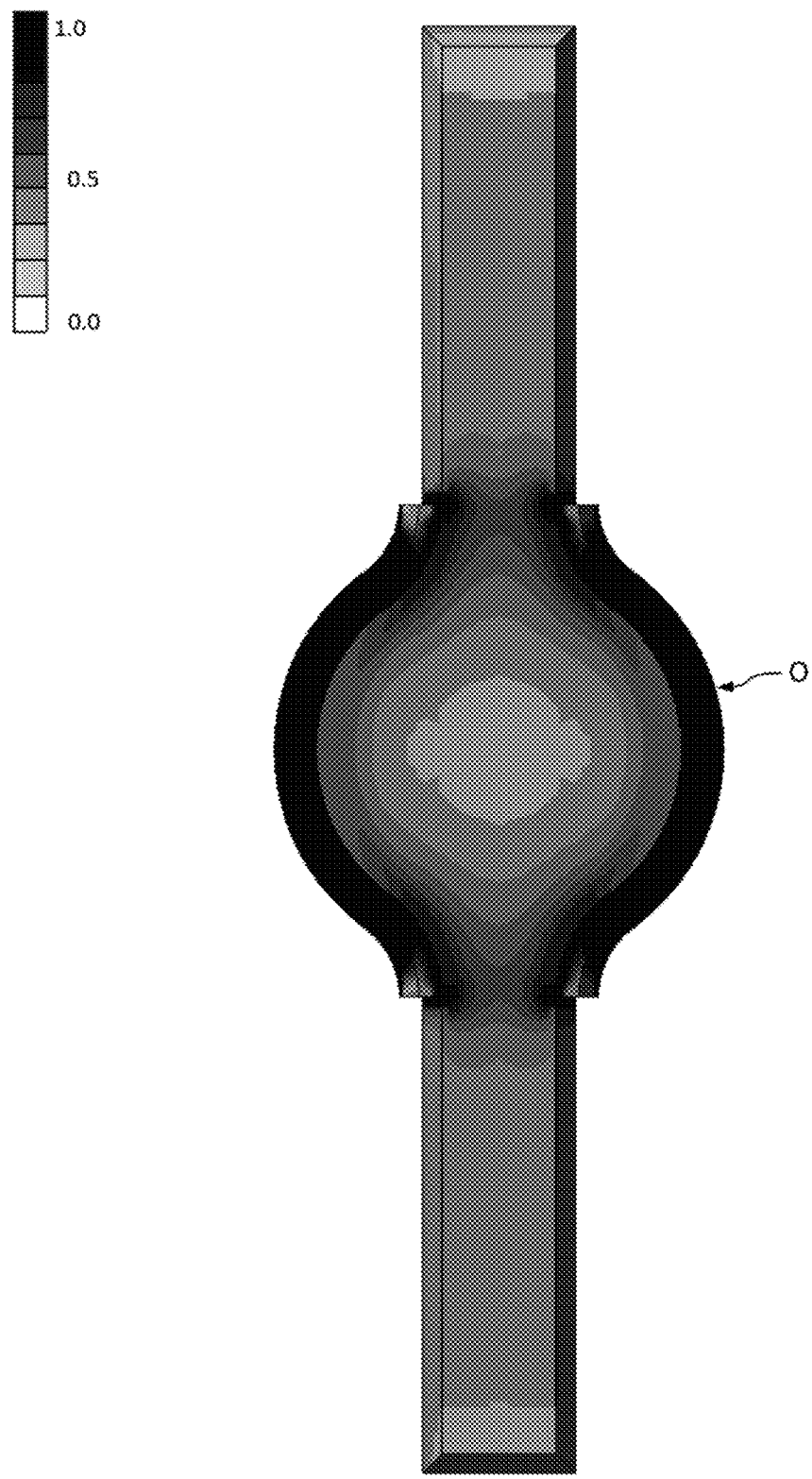
FIG. 22 illustrates a simulation result of Comparative Example 1.

The stress generated at the third part of the laminated body was calculated by simulation using a finite element method. FIG. 21 illustrates a simulation result of Example 1. FIG. 22 illustrates a simulation result of Comparative Example 1.

In Example 1, as illustrated in FIG. 21, the first part and the second part have an oxidized region O, and the third part does not have the oxidized region O. In Comparative Example 1, as illustrated in FIG. 22, the third part has the oxidized region O, and the first part and the second part do not have the oxidized region O. In the simulation, the width of the oxidized region O was 1 μm, and the thickness of the laminated body was 3 μm. FIGS. 21 and 22 illustrate that the darker the part, the greater the stress is generated, and the part with the strongest stress is illustrated as black as "1.0".

As illustrated in FIGS. 21 and 22, a greater stress was generated at the center of the third part of Example 1 than at the center of the third part of Comparative Example 1. Accordingly, it was found that, even when the third part does not have the oxidized region O, stress was generated at the center of the third part.

Figure 23:
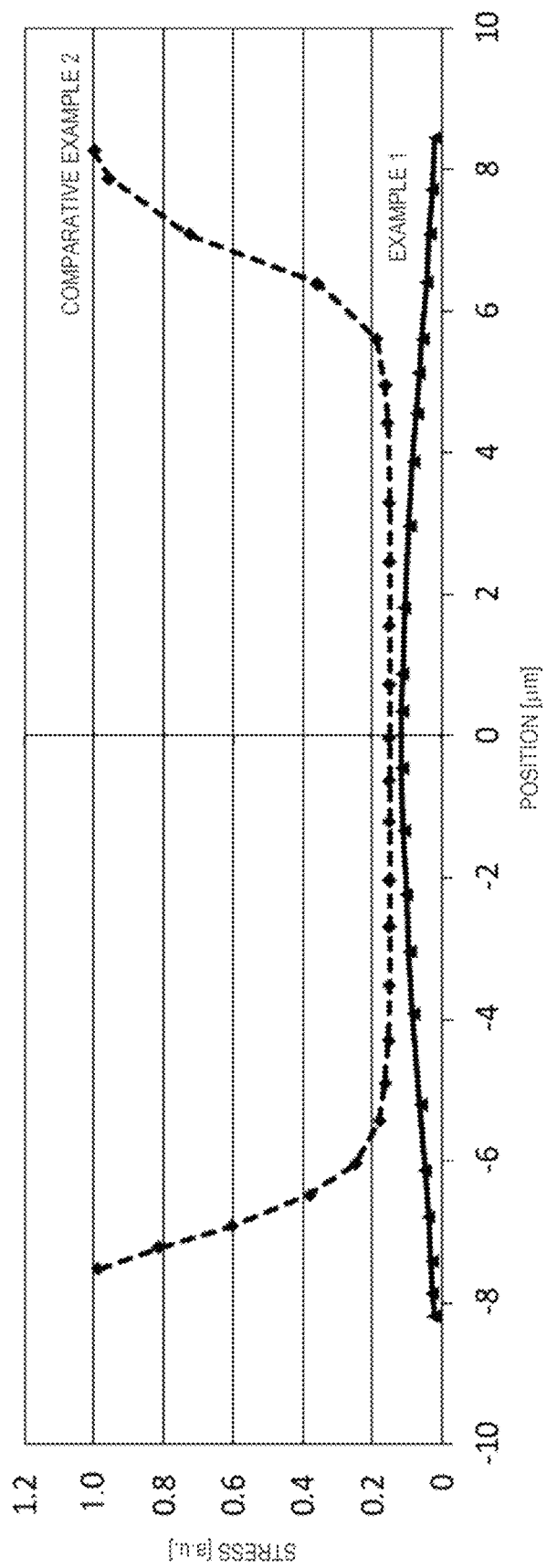
FIG. 23 is a graph illustrating stress of Example 1 and Comparative Example 2.

FIG. 23 is a graph illustrating the stress in the cross section taken along the line XXIII-XXIII in FIG. 21. In FIG. 23, the horizontal axis indicates the position from the center of the third part, and the center is "0". The vertical axis indicates the stress normalized by setting the maximum value of the obtained stresses to "1.0". In FIG. 23, the solid line indicates the result of Example 1 illustrated in FIG. 21. The broken line is the result of Comparative Example 2 in which the first part, the second part, and the third part have the oxidized region O having a width of 1 μm.

As illustrated in FIG. 23, at the center of the third part of Example 1, the stress was comparable to that of Comparative Example 2. Moreover, the stress was small compared to Comparative Example 2 at the position away from the center. From FIG. 23, it was found that, in Example 1, it was possible to reduce the stress that causes defects at a position away from the center while the stress necessary for polarization was ensured at the center of the third part.

In the present disclosure, a part of the configuration may be omitted within a range having the characteristics and effects described in the application, or each embodiment or modification examples may be combined.

The present disclosure is not limited to the above-described embodiments, and various modifications can be made. For example, the present disclosure includes substantially the same configuration as that described in the embodiments. The substantially same configuration is, for example, a configuration having the same function, method, and result, or a configuration having the same purpose and effect.

In addition, the present disclosure includes a configuration in which a non-essential part of the configuration described in the embodiments is replaced. In addition, the present disclosure includes a configuration that exhibits the same operational effects as those of the configuration described in the embodiment or a configuration that can achieve the same purpose. In addition, the present disclosure includes a configuration in which a known technique is added to the configuration described in the embodiments.

What is claimed is:

1. A semiconductor laser comprising:
a first mirror layer;
a second mirror layer;
an active layer disposed between the first mirror layer and the second mirror layer;
a current confinement layer disposed between the first mirror layer and the second mirror layer;
a first region provided continuously with the first mirror layer and including a plurality of first oxidized layers; and
a second region provided continuously with the second mirror layer and including a plurality of second oxidized layers, wherein
the first mirror layer, the second mirror layer, the active layer, the current confinement layer, the first region, and the second region constitute a laminated body,
the first region and the second region constitute an oxidized region of the laminated body,
in a plan view, the laminated body includes a first part, a second part, and a third part disposed between the first part and the second part and resonating light generated in the active layer, and
in a plan view, at least at a part of the third part, $$W1 > W3 \text{ and } W2 > W3 \quad (1)$$

W1 is a width of the oxidized region of the first part,
W2 is a width of the oxidized region of the second part, and
W3 is a width of the oxidized region of the third part.

2. The semiconductor laser according to claim 1, wherein W3=0.

3. The semiconductor laser according to claim 1, wherein W3>0.

4. The semiconductor laser according to claim 1, wherein the expression (1) is satisfied at the entire third part.

5. The semiconductor laser according to claim 1, wherein the expression (1) is satisfied at a part of the third part.

6. The semiconductor laser according to claim 1, wherein the laminated body includes a fourth part,
a gap is provided between a first side surface of the third part and a second side surface of the fourth part, and
the expression (1) is satisfied at a part that faces the gap of the first side surface.

7. The semiconductor laser according to claim 6, wherein the fourth part includes a third oxidized layer, and the current confinement layer and the third oxidized layer are continuous with each other.

8. The semiconductor laser according to claim 1, further comprising:
a layer that covers a part of the third part, wherein
the expression (1) is satisfied at the part of the third part that covered by the layer.

9. An atomic oscillator comprising:
a semiconductor laser;
an atom cell irradiated with light emitted from the semiconductor laser and containing alkali metal atoms; and
a light receiving element that detects intensity of light transmitted through the atom cell and outputs a detection signal, wherein
the semiconductor laser includes
a first mirror layer,
a second mirror layer,
an active layer disposed between the first mirror layer and the second mirror layer,
a current confinement layer disposed between the first mirror layer and the second mirror layer,
a first region provided continuously with the first mirror layer and including a plurality of first oxidized layers, and
a second region provided continuously with the second mirror layer and including a plurality of second oxidized layers,
the first mirror layer, the second mirror layer, the active layer, the current confinement layer, the first region, and the second region constitute a laminated body,
the first region and the second region constitute an oxidized region of the laminated body,
in a plan view, the laminated body includes a first part, a second part, and a third part disposed between the first part and the second part and resonating light generated in the active layer, and
in a plan view, at least at a part of the third part, $$W1 > W3 \text{ and } W2 > W3 \quad (1)$$

W1 is a width of the oxidized region of the first part,
W2 is a width of the oxidized region of the second part, and
W3 is a width of the oxidized region of the third part.

* * * * *